(12) United States Patent
Horch et al.

(10) Patent No.: US 9,553,207 B2
(45) Date of Patent: Jan. 24, 2017

(54) NVM DEVICE USING FN TUNNELING WITH PARALLEL POWERED SOURCE AND DRAIN

(71) Applicant: Synopsys, Inc., Mountain View, CA (US)

(72) Inventors: Andrew E. Horch, Seattle, WA (US); Troy N. Gilliland, Bellevue, WA (US)

(73) Assignee: Synopsys, Inc., Mountain View, CA (US)

( * ) Notice: Subject to any disclaimer, the term of this patent is extended or adjusted under 35 U.S.C. 154(b) by 152 days.

(21) Appl. No.: 14/036,249

(22) Filed: Sep. 25, 2013

(65) Prior Publication Data
US 2015/0085585 A1    Mar. 26, 2015

(51) Int. Cl.
| H01L 29/788 | (2006.01) |
| G11C 16/14 | (2006.01) |
| G11C 16/04 | (2006.01) |
| H01L 27/115 | (2006.01) |
| H01L 27/02 | (2006.01) |

(52) U.S. Cl.
CPC ....... *H01L 29/7883* (2013.01); *G11C 16/0441* (2013.01); *G11C 16/14* (2013.01); *H01L 27/11558* (2013.01); *H01L 27/0207* (2013.01)

(58) Field of Classification Search
CPC ............ H01L 27/0629; H01L 27/11558; H01L 27/1156; H01L 29/7883; G11C 16/0441
See application file for complete search history.

(56) References Cited

U.S. PATENT DOCUMENTS

| 6,566,705 | B1 * | 5/2003 | Church | H01L 29/7885 257/314 |
| 6,788,574 | B1 * | 9/2004 | Han | G11C 16/0408 257/E21.694 |
| 7,391,647 | B2 * | 6/2008 | Fang | G11C 16/0408 257/E21.694 |
| 7,671,401 | B2 * | 3/2010 | Fang | G11C 16/0416 257/318 |
| 7,718,492 | B2 | 5/2010 | Horch | |
| 7,800,156 | B2 | 9/2010 | Roizin et al. | |
| 7,859,043 | B2 | 12/2010 | Pikhay et al. | |

(Continued)

FOREIGN PATENT DOCUMENTS

TW     201336055 A     9/2013

OTHER PUBLICATIONS

U.S. Appl. No. 13/954,383, filed Jul. 30, 2013, Inventor Andrew E. Horch.

(Continued)

*Primary Examiner* — Allison P Bernstein
(74) *Attorney, Agent, or Firm* — Fenwick & West LLP

(57) ABSTRACT

A nonvolatile memory ("NVM") bitcell includes a capacitor, a transistor, and a tunneling device. The capacitor, transistor, and tunneling device are each electrically coupled to different active regions and metal contacts. The three devices are coupled by a floating gate that traverses the three active regions. The tunneling device is used to program and erase the device, allowing for faster page erasure, and thus allows for rapid testing and verification of functionality. The transistor is used to read the logical state of the floating gate. The capacitor and floating gate are capacitively coupled together, removing the need for a separate selection device to perform read, write, and/or erase operations.

19 Claims, 14 Drawing Sheets

(56) References Cited

U.S. PATENT DOCUMENTS

| | | |
|---|---|---|
| 7,939,861 B2 | 5/2011 | Horch |
| 7,948,020 B2 | 5/2011 | Roizin et al. |
| 7,983,093 B2 | 7/2011 | Horch |
| 8,194,468 B2 | 6/2012 | Horch |
| 8,373,167 B2 | 2/2013 | Horch |
| 8,674,422 B2 | 3/2014 | Horch |
| 8,853,761 B2 | 10/2014 | Horch |
| 2013/0193498 A1 | 8/2013 | Horch |
| 2013/0193501 A1 | 8/2013 | Horch |
| 2015/0034909 A1 | 2/2015 | Horch |

OTHER PUBLICATIONS

Taiwan Office Action, Taiwan Application No. 103131433, May 13, 2016, 11 pages (with concise explanation of relevance).
Chinese First Office Action, Chinese Application No. 20140494289. 7, Nov. 4, 2016, 12 pages (with concise explanation of relevance).

* cited by examiner

As Planned

In Process

As Planned

In Process

US 9,553,207 B2

NVM DEVICE USING FN TUNNELING WITH PARALLEL POWERED SOURCE AND DRAIN

BACKGROUND

1. Field of Art

This disclosure generally relates to the field of nonvolatile memory, particularly non volatile memory bitcell layouts.

2. Description of the Related Art

Nonvolatile memory (NVM) refers to memory that persistently stores information bits when not powered. A nonvolatile memory bitcell (NVM bitcell) stores a single bit of data. Some types of NVM bitcells are implemented using transistors with floating gates. The amount of charge residing on a floating gate determines whether the bitcell is storing a logical "1" or a logical "0". The floating gate is referred to as "floating" because the gate is electrically isolated from the surroundings by an oxide or dielectric. Some NVM can store more than one state in the bitcell.

In order to expand applications and reduce costs of memory devices, it is desirable to accommodate a large number of bitcells in a given area. It is also desirable to decrease the cost of fabricating each bitcell by using standard complementary metal-oxide-semiconductor manufacturing processes ("CMOS processes"). Currently available memory devices include EEPROM and FLASH (and eFLASH), both of which have disadvantages. Currently, FLASH has a very small bitcell, but requires steps in addition to the standard CMOS process, which increases the cost of producing the bitcell and possibly changes the performance or characteristics of the produced devices. EEPROM is compatible with standard CMOS processes, but has a relatively large bitcell size, and thus is only suitable for low bit count memories.

SUMMARY

A nonvolatile memory ("NVM") bitcell includes three devices: a transistor, a capacitor, and a tunneling device. In the bitcell, the three devices are linked by a single floating gate. The tunneling device and capacitor may be formed either in a native region or in an N-well region which might also be within a native region. The transistor is formed in a well region. The bitcell is programmed and erased using the tunneling device and/or read transistor, and is read using the transistor. In an NVM memory device including these bitcells, the sources and drains of the transistors of the bitcells are powered along parallel columns, the tunneling devices are powered along rows, and the capacitors are powered along another set of rows. The operation performed at any given time is determined based on, for example, (i) the voltages at the source and drain of the transistor, (ii) the voltage on the active region of the tunneling device, and (iii) the voltage on the active region functioning as one plate of the capacitor.

DETAILED DESCRIPTION

Figure 1A:
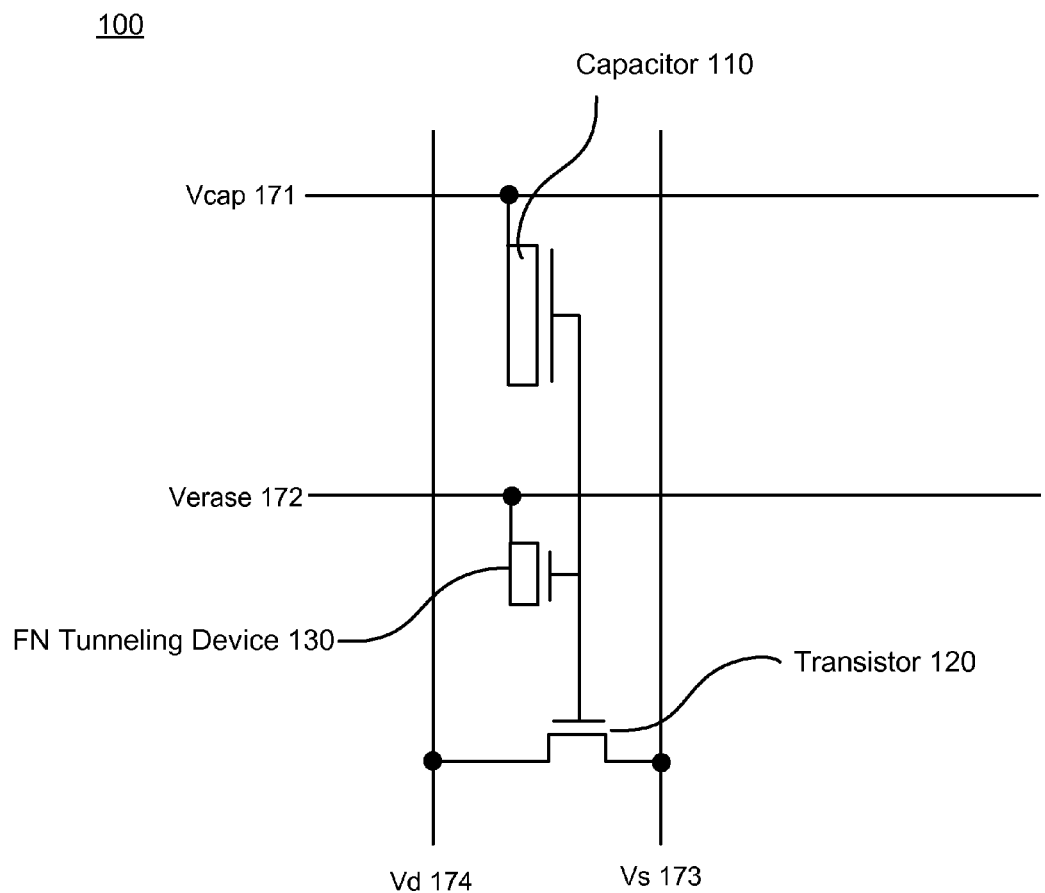
FIG. 1A is a circuit diagram of an NVM bitcell, according to one embodiment.

Embodiments relate to a nonvolatile memory ("NVM") bitcell (or bit, or bitcell) including three devices: a metal-oxide-semiconductor field effect transistor (MOSFET, referred to simply as the transistor or read device), a capacitor, and a Fowler-Nordheim (FN) tunneling device. Notably, the bitcell lacks a separate selection device. In the bitcell, the three devices are linked by a single floating gate. The FN tunneling device and capacitor may be formed either in a native region or in an N-well region itself might be within a native region. The transistor is formed in a P-well region. The bitcell is erased using the FN tunneling device, and is programmed and read using the transistor (also referred to as a read device). In an NVM memory device including these bitcells, the sources and drains of the transistors of the bitcells are powered by power supply lines extending along parallel columns, the FN tunneling devices are powered by power supply lines extending along rows, and the capacitors are powered by power supply lines extending along another set of rows. The operation performed at any given time is determined based on, for example, (i) the voltages at the source and drain of the transistor, (ii) the voltage on the active region of the FN tunneling device, and (iii) the voltage on the active region functioning as one plate of the capacitor. The substrate is always held at a constant voltage, typically ground.

A NVM memory device can be manufactured including a number of these bitcells (or bits). In one embodiment, the NVM memory device has between 4 k and 512 k bits, and is capable of being reliably used in applications preferring a write cycle endurance of anywhere from 1 to 100000 writes over the lifetime of the NVM memory device.

The NVM memory device and NVM bitcells within have advantages over existing NVM, FLASH, and EEPROM solutions. The NVM memory device has a higher bitcell density than existing EEPROM. The NVM memory device achieves a higher bitcell density per unit area/per unit volume than existing NVM by not requiring a separate selection device (commonly referred to as a logic transistor) to choose which bits to erase, program, and/or read. The NVM memory device also simplifies erasing operations and testing, as the FN tunneling device of each bitcell shares a power contact with the FN tunneling devices of other bitcells on at least the same row, and in some implementations other rows as well. This helps save bitcell space, in addition to allowing for simultaneous erasure of all bitcells sharing that row contact, which significantly speeds testing of the NVM memory device for functionality. At an individual bitcell level, the bitcells of the NVM memory device are smaller than individual planar EEPROM bits and uses a simpler process than FLASH or eFLASH bits require. Additional space may be saved in a NMOS implementation relative to a PMOS implementation through the removal of N-well implants. FN Tunneling is preferred over BTBT, CHEI or CHISEL due to its low power requirement. To decrease erase time, FN Tunneling can be performed on a large number of bits in parallel. For example, with FN Tunneling an entire array of 512K bits can be erased in a single operation. This allows for fast and inexpensive testing of the memory array.

The NVM memory device also has a lower manufacturing cost than a FLASH or eFLASH device because it can be manufactured using a standard complementary metal-oxide-semiconductor manufacturing logic process ("standard CMOS logic process") that is well understood in the art. Thus, NVM memory device does not require process steps in addition to the standard CMOS logic process in generating a FLASH-type device. Hence, NVM memory devices does not result in increase in the cost of manufacturing.

Row Column Architecture of NVM Memory Device

FIG. 1A is a circuit diagram of an NVM bitcell 100, according to one embodiment. The bitcell 100 includes a capacitor 110, a Fowler-Nordheim (FN) tunneling device 130, and a transistor 120. The source and drain of the transistor 120 are electrically coupled to substantially parallel metal lines Vs 173 and Vd 174, respectively. The metal lines 173 and 174 are also electrically coupled to other bitcells in a memory device along a single column in a row-column type architecture. The capacitor 110 and FN tunneling device 130 are electrically coupled to substantially parallel metal lines Vcap 171 and Verase 172, respectively. The metal lines 171 and 172 are also electrically coupled to other bitcells along the same row in the row-column type architecture. This choice of orientation is merely exemplary, and could be reversed in another implementation. Additional metal lines can be added if either rows are columns need to be divided into small blocks for any reason. In the example of FIG. 1A, all the devices are NMOS with their wells being shorted to ground. The ground connection is not shown to simplify the diagram. If the capacitor and tunnel device were PMOS the N-Wells or the corresponding devices would be shorted to the same metal line their source/drains are connected to.

Figure 1B:
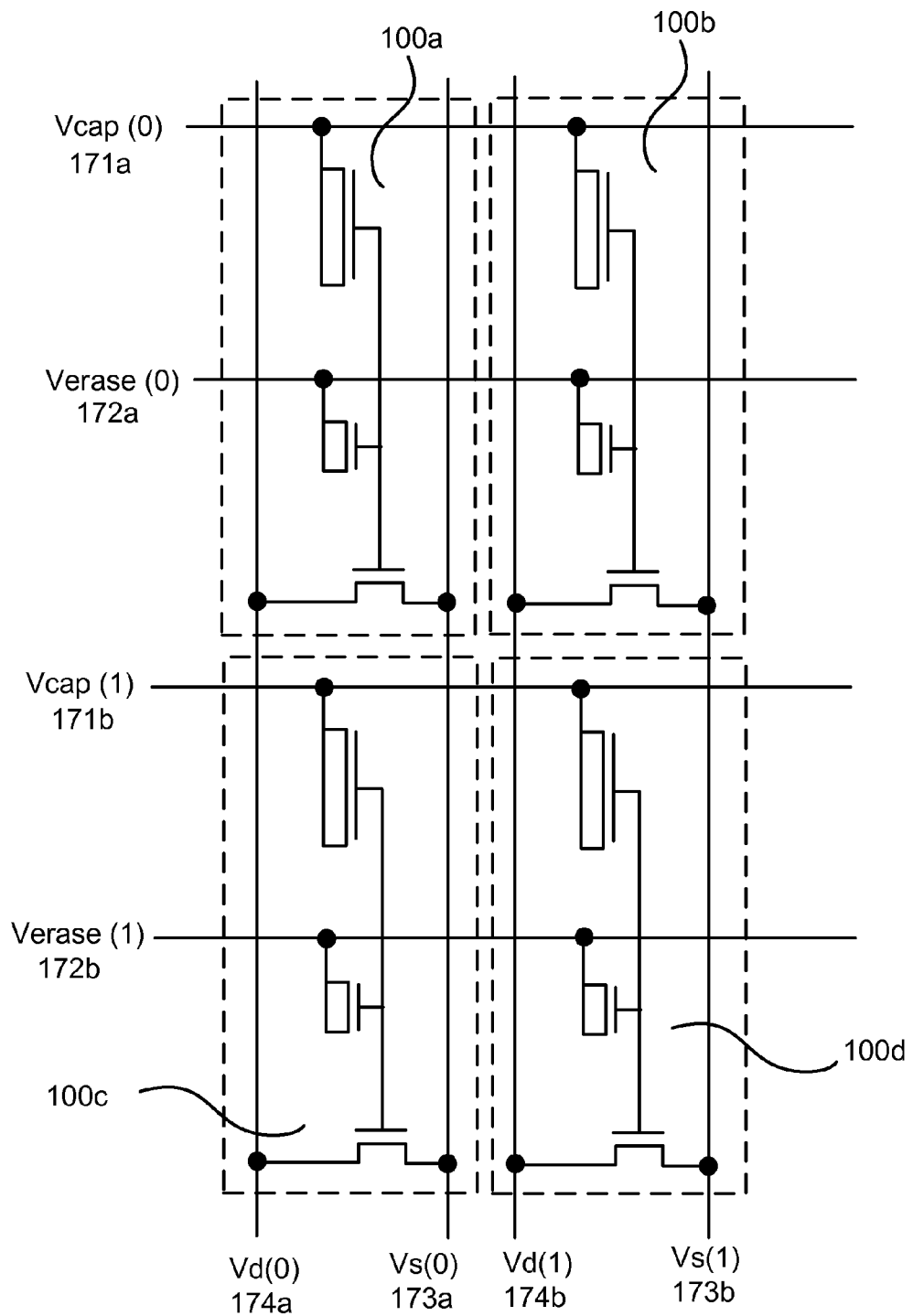
FIG. 1B is a circuit diagram of a number of NVM bitcells in a NVM memory device, according to one embodiment.

FIG. 1B is a circuit diagram of a number of NVM bitcells 100a through 100d in a NVM memory device of a row-column architecture, according to one embodiment. As illustrated, the sources of bitcells 100a and 100c are both electrically coupled to column 0 metal line 173a, and the drains of bitcells 100a and 100c are both electrically coupled to column 0 metal line 174a. Similarly, the sources and drains of bitcells 100b and 100d are coupled to column 1 metal lines 173b and 174b, respectively. The capacitors of bitcells 100a and 100b are both electrically coupled to row 0 metal line 171a, and the FN tunneling devices of bitcells 100a and 100b are both electrically coupled to row 0 metal line 172a. Similarly, the capacitors and FN tunneling devices of bitcells 100c and 100d are coupled to row 1 metal lines 171b and 172b, respectively.

Although not shown, several rows may be electrically coupled together in a memory device. By grouping rows together, more bits can be erased in a single operation. This also reduces the number of tunnel junction row logic switches that are needed to couple together independent rows or sets of rows of FN tunneling devices. As a result, this reduces both the erase time per bit as well as the size of the control logic devices controlling the bitcells. Because rows are shared, the tunnel junctions joining rows are incapable of being raised to so high a voltage that FN tunneling occurs on unselected rows.

Overall Structure of PMOS NVM Bitcell

Figure 2A:
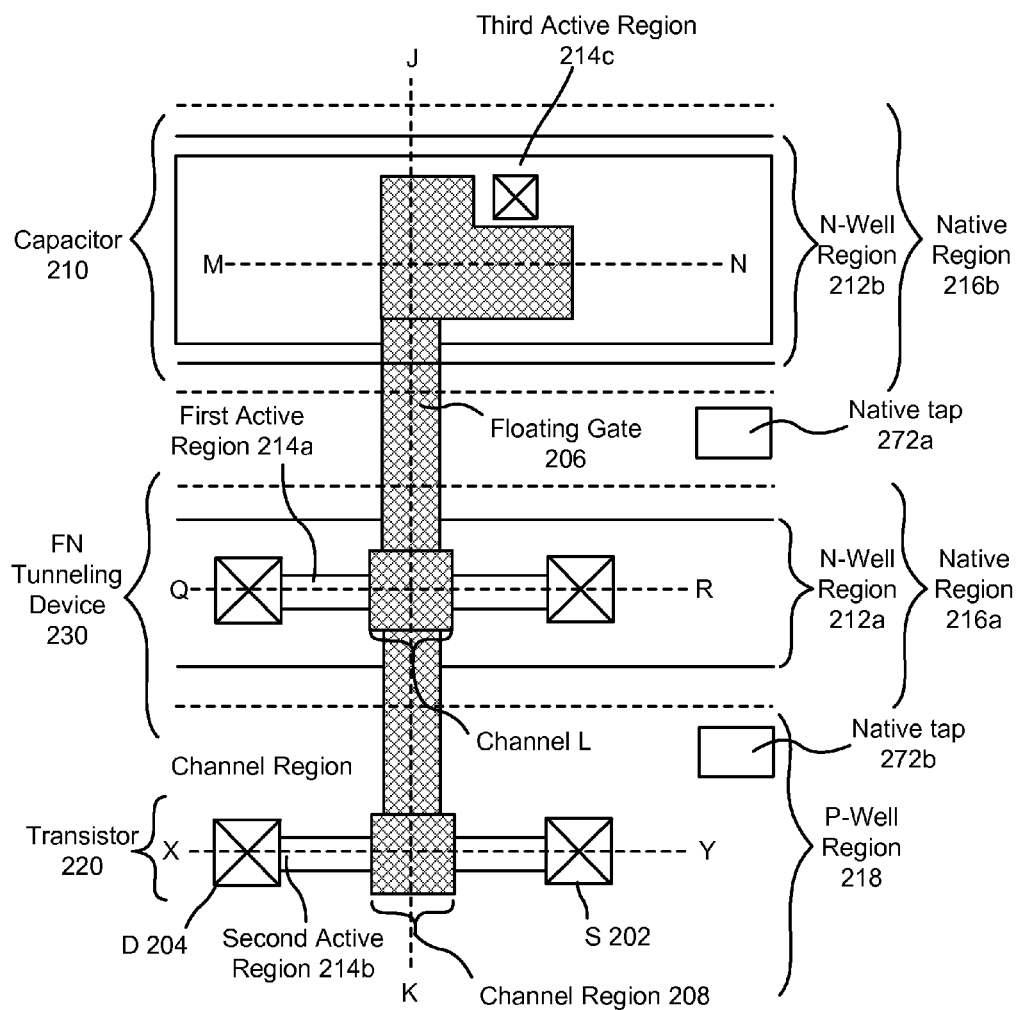
FIG. 2A is a top view of a PMOS NVM bitcell, according to one embodiment.

FIG. 2A illustrates a top view of a PMOS NVM bitcell 200 according to one embodiment. The bitcell 200 may include, among other components, a capacitor 210, a FN tunneling device 230, and a transistor 220. A floating gate 206 traverses the capacitor 210, the transistor 220, and the FN tunneling device 230. Each of these devices includes separate active region 214a through 214c of a substrate. That is, the capacitor 210 includes the third active region 214c, the FN tunneling device 230 includes the first active region 214a, and the transistor includes the second active region 214b.

The bitcell 200 is a PMOS bitcell because the capacitor 210 and the FN tunneling device 230 are each formed with N-well implant 212a, 212b. The active regions 214a, 214b, and 214c are largely (though not perfectly) electrically isolated from each other by one or more nonconductive regions (not shown). Nonconductive regions may be constructed using oxides, shallow trench isolations (STI), deep trench isolations, or other similar mechanisms. The FN tunneling device 230 is positioned between the capacitor 210 and the transistor 220 along line J-K. This positioning of devices helps increase the bitcell density of the NVM memory device. In some embodiments the capacitor 210 can be shared between rows. By placing the capacitor on the edge of the bitcell (either top or bottom) it is possible for the bitcell to be mirrored in an array so the capacitor is shared between two rows.

The floating gate 206 is formed of a conductive layer of material, such as polysilicon. The floating gate 206 may be a planar layer formed on top of the substrate. Alternatively, the floating gate 206 may be implemented as a multigate transistor such as Fin field effect transistor (or FinFET) (not shown). The FinFET differs from a normal FET in that the floating gate wraps around the conducting channel between the source and drain, creating a structure that looks like a "fin". In the same or a different embodiment, the substrate in which the active regions are formed may be a ultra thin body silicon on insulator (UTB-SOI) having a thickness of approximately 5 nm. Such a design reduces short-channel effects and suppresses leakage by keeping gate capacitance in closer proximity to the whole of the channel.

With regard to the transistor 220, the second active region 214b includes both the source 202 and the drain 204 of the transistor. The source 202 and the drain 204 are separated by a channel region 208 underneath the portion of the floating gate 206 overlapping with the second active region 214b. The source 202 and drain 204 are formed in portions of the second active region 214b extending around the edge of the portion of the floating gate 206 overlapping with the second active region 214b. The second active region 214b includes a P-well doping underneath the floating gate 206. The transistor's 220 dopings and cross sectional structure are further described below with respect to FIG. 2B.

The capacitor 210 is defined by two plates, the first plate being the third active region 214c, and the second plate being the portion of the floating gate 206 extending over the third active region 214c. The capacitor 210 may be formed in a doped N-well region 212b formed within a native region 216b (as illustrated) or the capacitor 210 may be formed in a native region without the N-well (see FIGS. 3A and 3B), depending upon the implementation. To preserve the native region, implants used to dope the substrate in the remainder of the bitcell are blocked during a fabrication process using one or more masks that cover the native regions 216. This helps ensure that charge carriers from those other dopings (such as the P-well doping of the transistor 220) do not penetrate into the third active region 214c. The masks used to preserve the native region is further described with respect to FIGS. 7A and 7B below. The capacitor's 210 dopings and cross sectional structure is further described with respect to FIG. 2C below.

A native region is a portion of the substrate or wafer that is undoped from its ordering state from the manufacturer prior to deposition of the floating gate. Generally, wafers are purchased having a particular density of charge carriers (e.g., $10^{15}$ cc/cm$^3$). All other dopings, e.g., P-well, N-well, N+, S/D extension, LDD, etc. change the charge carrier density in that region from the native region's original density. In some processes the native region is replaced by a growing a thin epitaxial layer of silicon with very low doped region with charge carrier densities less than or equal to $10^{16}$ cc/cm$^3$. Masks are used to preserve native regions in their original undoped state when implantation is performed on other regions of the bitcell.

Figure 3A:
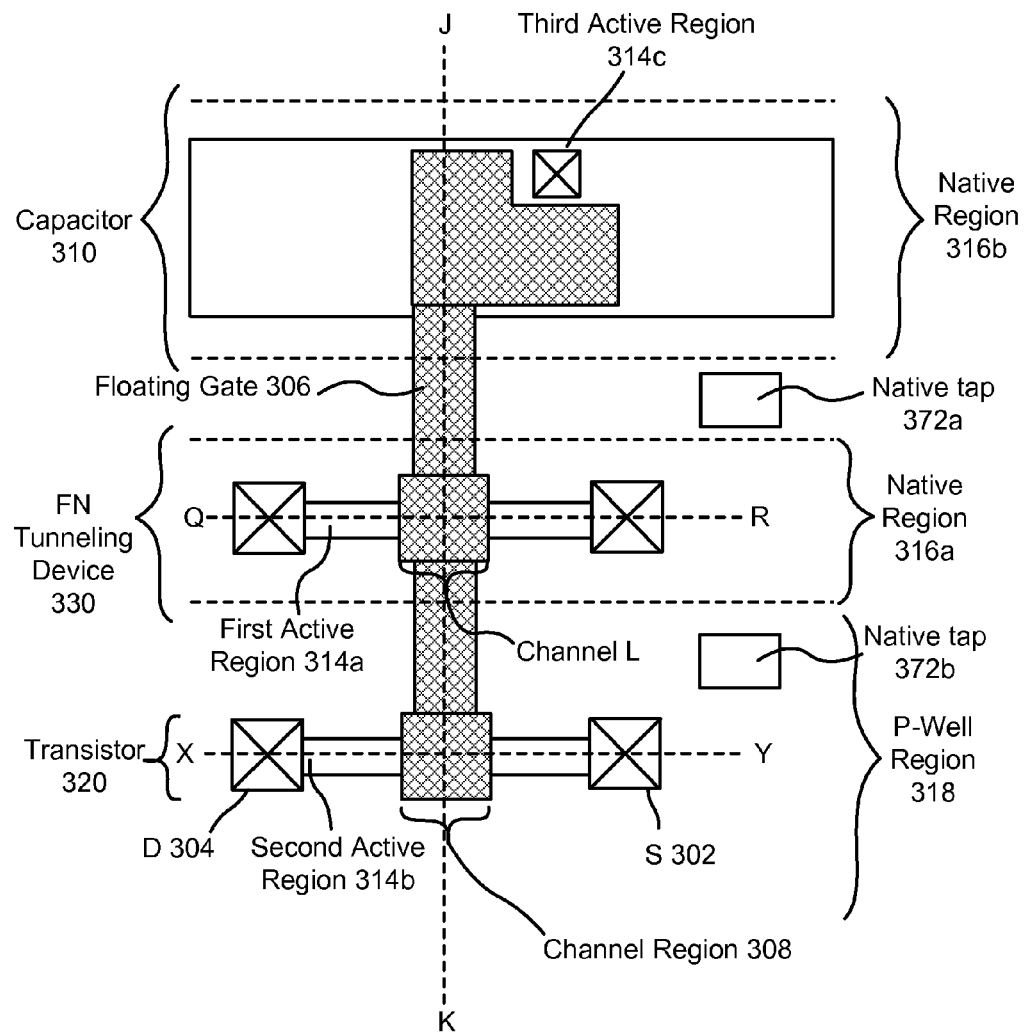
FIG. 3A is a top view of an NVM bitcell, according to another embodiment.

The extent of the masks determines the size of the native regions. In the example embodiment of FIG. 2A, the masks extend past the edge of the first 214a and third 214c active regions. There are regions of the substrate that are native regions that are not part of the masked active region (not separately labeled). These regions are referred to as non-active native regions or isolation regions. When placed next to an N-Well, native regions increase the N/P diode break down. For example, a device having an N-Well with charge carrier concentration of $10^{17}$ cc/cm$^3$ a native region with charge carrier concentration of $10^{15}$ cc/cm$^3$, and a P-Well with charge carrier concentration of $10^{17}$ cc/cm$^3$ will have a diode breakdown voltage that is significantly higher than that of a mere N-Well/P-Well combination, with the diode breakdown voltage being a function of the native region width. In a bitcell with where the capacitor and tunnel device are NMOS, the native region is used both to increase diode breakdown and help in the formation of the capacitor, for example as illustrated in FIG. 3A.

The FN tunneling device 230 is formed of the first active region 214a and the floating gate 206. The FN tunneling device 230 is formed in either a doped N-well region 212a formed within a native region 216a (as illustrated in FIG. 2A), or it may be formed in a native region without the N-well (see FIGS. 3A and 3B). As with the capacitor 210, in the FN tunneling device 230 the floating gate 206 extends at least partially over the first active region 214a. In contrast, however, the portion of the floating gate 206 over the first active region 214a is narrower and smaller in surface area than the portion of the floating gate 206 over the third active region 214c. Consequently, dopings in the first active region 214a underneath this portion of the floating gate 206 electrically short the first active region 214a on either side of the floating gate 206. This electrical short allows a wide range of voltages to be applied to the first active region 214a to induce FN tunneling, as well as allowing the first active region 214a to be shared between FN tunneling devices of other bitcells along a row. The FN tunneling device 230 is formed in a native region using a mask, with or without an implanted N-well, both to ensure there is an electrical short between the active regions on either side of the gate 206 and to increase the voltage that can be applied to active region 214a without diode breakdown behavior occurring. The FN tunneling device's 230 cross sectional structure is further described with respect to FIG. 2D below.

The bitcell 200 is associated with at least four separate electrical contacts that can apply voltage/current to the bitcell 200, thereby affecting the voltage level and amount of charge on the floating gate 206. The source 202 of the transistor 220 is electrically coupled to a first contact coupled to a source metal line Vs, the drain 204 of the transistor 220 is electrically coupled to a second contact coupled to a drain metal line Vd, the capacitor 210 is electrically coupled to a third contact coupled to a capacitor metal line Vcap, and the FN tunneling device is electrically coupled to a fourth contact coupled to a program/erase metal line Verase. The third contact can be shared between multiple capacitors of multiple bitcells along a row, and the fourth contact can be shared between multiple FN tunneling devices of multiple bitcells along one or more rows. These contacts are not separately labeled for clarity.

Typically, the starting wafer for the bitcell is slightly p-type (P-Substrate). As above, the starting material is defined as the native region or substrate. Any continuous region of the substrate with the same doping type electrically shorts with itself. For example, a P-Well touching a P-Substrate (native region) are electrically shorted together. The native taps 272a and 272b adjacent to the native region act as external access points to these electrically shorted regions. They can be in between every bitcell as shown in FIG. 2A, or they be between every Nth bitcell (e.g., where N is 8 or 16 bitcells).

Figure 2B:
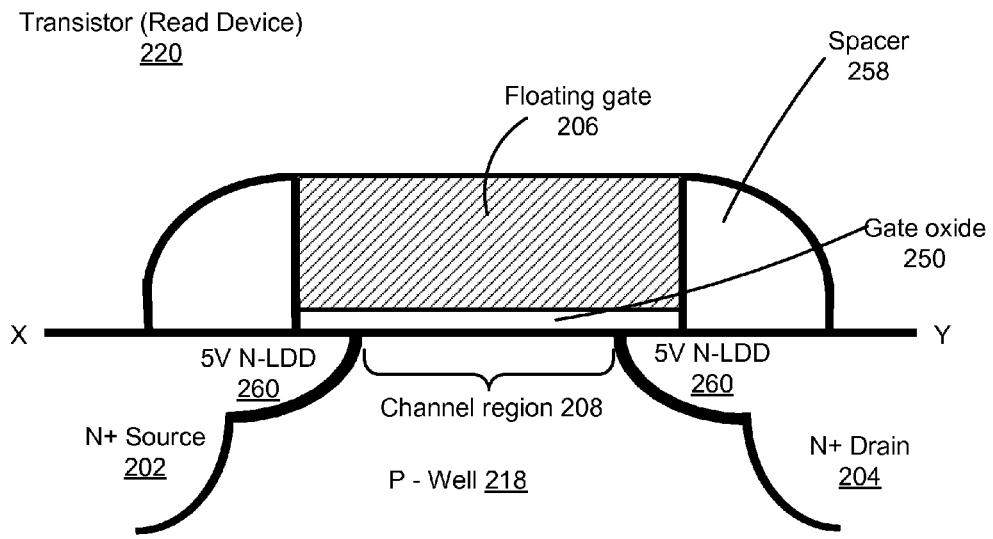
FIG. 2B is a cross sectional view of a read transistor of the NVM bitcell taken along line X-Y of FIG. 2A, according to one embodiment.
Figure 2C:
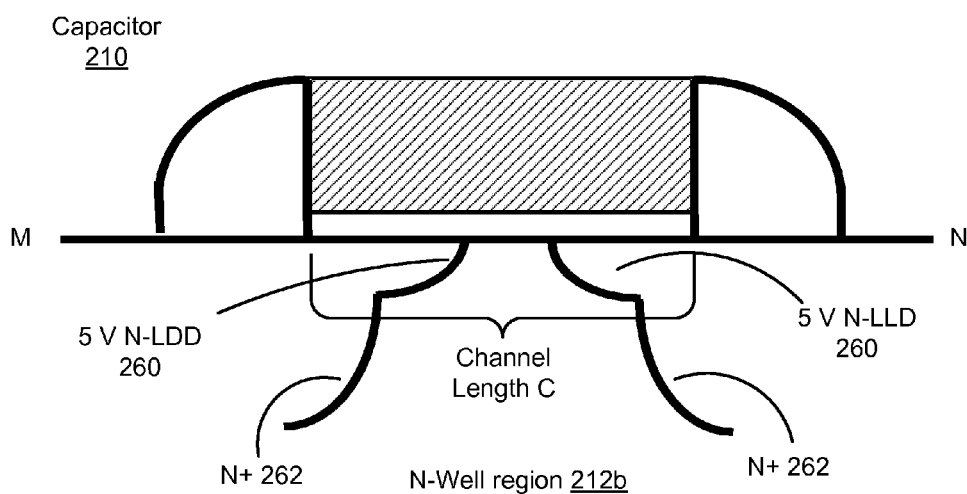
FIG. 2C is a cross sectional view of a capacitor of the NVM bitcell taken along line M-N of FIG. 2A, according to one embodiment.
Figure 2D:
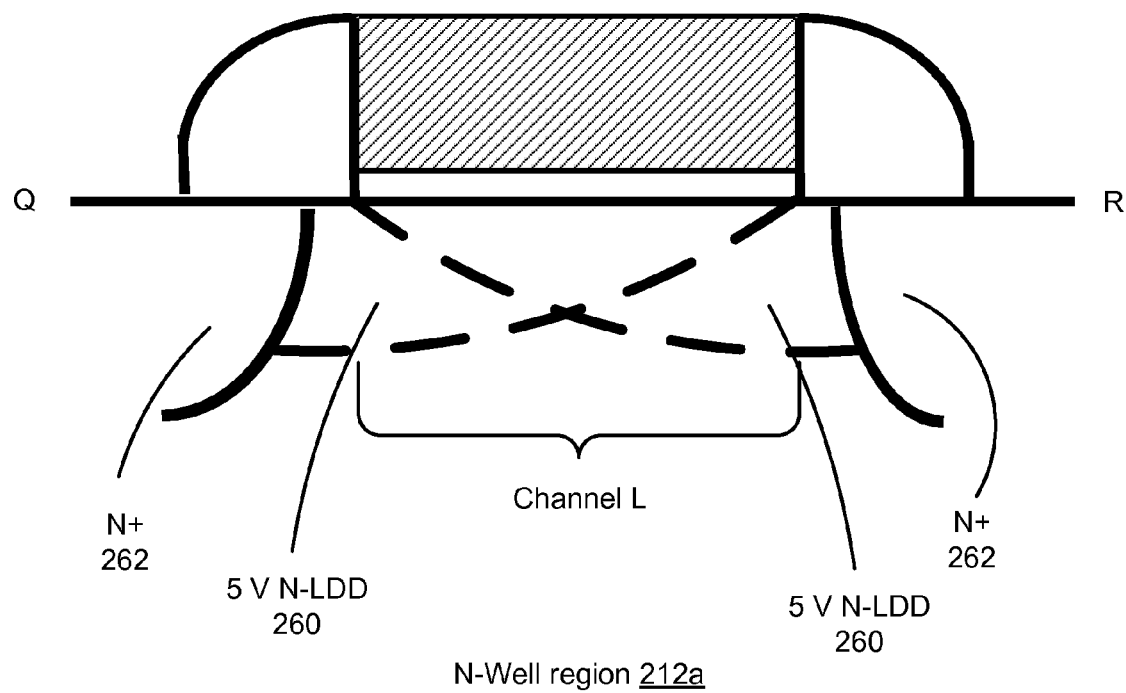
FIG. 2D is a cross sectional view of a FN tunneling device of the NVM bitcell taken along line Q-R of FIG. 2A, according to one embodiment.
Figure 2E:
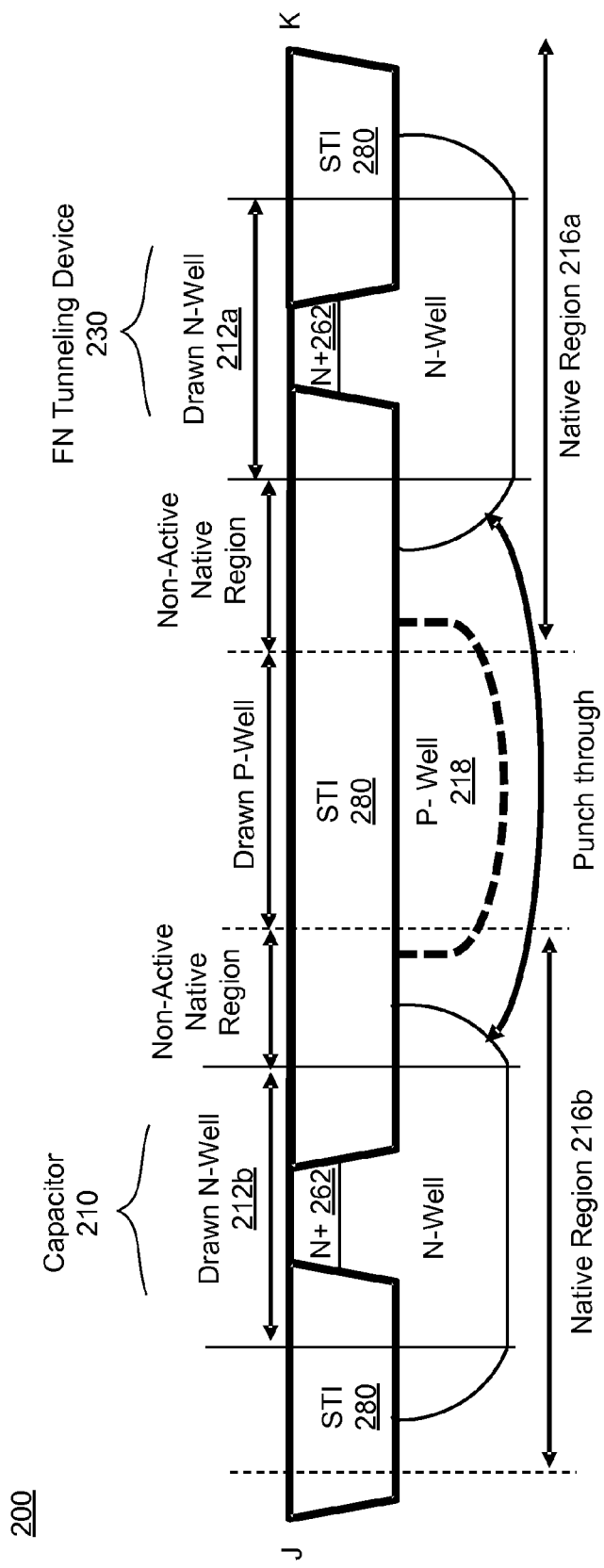
FIG. 2E is a cross sectional view of a portion of a PMOS NVM bitcell including a capacitor and a FN tunneling device taken along line J-K of FIG. 2A according to an embodiment.

FIG. 2E is a cross sectional view of a portion of the PMOS NVM bitcell 200 including the capacitor 210 and FN tunneling device 230 taken along line J-K of FIG. 2A according to an embodiment. The capacitor 210 and FN tunneling device 230 are each formed in a N-well 212 within a native region 216. The active regions 214 are separated by one or more STIs 280. FIG. 2E illustrates how the native region masks, drawn to define the native region and the region where the P-well 218 is implanted, help electrically isolate the N-wells 212b and 212a of the capacitor 210 and FN tunneling device 230, respectively, from each other. The non-active portion of the native regions assist in the isolation at the expense of additional substrate space. However, under application of high voltages to the capacitor 210 and/or FN tunneling device 230, punch through can occur, thereby limiting the voltages at which FN tunneling can occur within bitcell 100.

An advantage of the N-well 212b is that the capacitor 210 always has a good contact with the third active region 214c, even when high, tunneling voltages Vtun are applied to the second active region 214b. As a result, the size and shape of the capacitor 210 is more flexible than in a NMOS implementation.

In a P-well implementation of bitcell 200 where the P-well is put under the capacitor, to counteract the sheet resistance of a P-well capacitor while maintaining similar capacitive coupling, the capacitor is configured to ensure that comparatively more dopants are present underneath the floating gate 206. This generally involves constructing a narrower floating gate 206 (e.g., with smaller channel length C) with increased perimeter distance, providing more edges for the dopants to be planted under. These additional dopants counteract the counter-dopants of the P-well, forestalling increased sheet resistance and offering better capacitive coupling at lower applied voltages.

However, increasing the capacitor's perimeter generally takes additional substrate surface area, thus decreasing bitcell density. In contrast, forming the bitcell in a native region saves on the space needed to form the capacitor. Despite this savings gain, however, forming the capacitor in a native region costs space in terms of the separation between the second 214b and third 214c active region used to ensure that P-well dopants for the second active region 214b do not implant into the third active region 214c. Although masks blocks most of these dopants, the well proximity effect can cause some dopants to implant regardless of the mask. Additional space between the second 214b and third 214c active regions can prevent this form of implantation into the third active region 214c at the cost of increased distance between the two regions, and therefore increased bitcell size. Consequently, space savings in one area using one implementation result in space costs in another implementation. Both approaches are viable, they simply trade off different requirements. A third approach is to add additional process steps. For example a shallow N-Well can the added to the process. Shallow N-Wells are typically used to make high density (90 nm and below) SRAM cells. If a shallow N-Well is added to the process of making bitcell 200, it can be used to reinforce the desired behavior of the devices of the bitcell. Some processes have $V_T$ adjust photo/implants steps. Any $V_T$ adjust implant of the appropriate polarity can be used to reinforce the short under the FN tunneling device or capacitor.

Example Structure and Operation of Transistor

Transistor 220 is used as a read device. FIG. 2B is a cross sectional view of an transistor of the NVM bitcell taken along line X-Y of FIG. 2A in the second active region 214b, according to one embodiment. Floating gate 206 sits on top of gate oxide 250. The floating gate 206 is surrounded by one or more spacers 258. The spacers may be made of an oxide or another nonconductive material. The gate oxide 250 rests on top of the second active region 214b. Active regions 214 may be a silicon substrate or a silicon-on-insulator (SOI) type substrate.

The second active region 214b is doped to create a P-well 218 having approximately $10^{17}$ charge carriers (cc) per cubic centimeter ($cm^3$) beneath the floating gate 206. The source 202 and drain 204 surround the P-well 218, and each is attached to a separate electrical contact (not shown). When an appropriate differential of bias voltages are applied between the source 202 and drain 204, and when the voltage on the floating gate 206 is sufficiently high, a channel 208 of charge carriers is formed near the surface of the P-well 218 underneath the floating gate 206. When this occurs the transistor is in the "on" state. Charge carrier flow is dictated by a number of factors including, for example, the voltages on the source 202 and drain 204, the charge on the floating gate 206, the voltage applied to the capacitor 210, the doping of the source 202 and drain 204, the doping of the P-well 218, the thickness of the gate oxide 250, and other characteristics of the bitcell 200 such as dimensions of the various components and the materials used.

The source 202 and drain 204 of the transistor 220 have similar dopings. Both include N+ dopings, having approximately $10^{20}$ cc/$cm^3$, where the N+ dopings extend at least partway under the spacers 258. Both also include a 5V NMOS implant, either a lightly doped drain (LDD) or source-drain extension (S/D) implant. The LDD and S/D extension implant are the same implant polarity, the implant is called an LDD implant if the concentration of charge carriers is $10^{19}$ cc/$cm^3$, whereas if the charge carrier concentration is $10^{20}$ cc/$cm^3$ it is instead called a S/D extension implant due to the charge carrier concentration being similar to the N+ dopings. The LDD implant may be diffused with a heat step to grade the junction with the P-well 218, thus allowing for higher voltages to be applied.

Other implementations of the transistor 220 alter the P-Well 218. In some instances, the bitcell may operate more efficiently if the P-Well 218 has a higher doping concentration. The P-Well doping concentration may be increased by adding additional and/or different P-type implants that are not normally used in 5V NMOS devices. For example, the P-well 218 may be doped to include both a 5V and a 1.8V P implant. As another example, the P-Well 218 may be formed using al 0.8V implant rather than a 5V implant as described above. As another example, a portion of the P-well 218 may be formed using a 1.8V implant, and another portion of the P-well 218 may be formed with a 5V implant. As another example, the P-well 218 may include a threshold voltage adjustment implant $V_T$ that alters the voltage at which the transistor turns on. In one embodiment, the threshold voltage adjustment implant makes the transistor 220 a high $V_T$ read device. In a NMOS transistor, this occurs where the threshold voltage adjustment implant adds more P-type dopant across some or all of the channel region 208 underneath the floating gate.

Operation of the transistor 220 in conjunction with the remainder of the bitcell 200 is described below.

Example Structure and Operation of FN Tunneling Device

The NVM bitcell allows individual or multiple bitcells to be programmed separately and for multiple bitcells on a single row or on multiple rows to be erased at the same time. FIG. 2D is a cross sectional view of a FN tunneling device 230 of the NVM bitcell 200 taken along line Q-R of FIG. 2A in the first active region 214a, according to one embodiment. As described above with reference to FIGS. 2A and 2E, the first active region 214a is formed in a native region 216a including an N-well implant 212a.

Above the substrate, the bitcell is the same as the transistor 220, except for the width of the floating gate 206. Generally, the portion of the floating gate 206 over the first active region 214a is narrow compared to widths elsewhere in the bitcell 200. Below the substrate within the first active region 214a, the devices differ in that the first active region 214a includes a N+ implant 262 that extends partway underneath the spacers and a 5V N-LDD implant 260 that extends all the way underneath the floating gate 206 to the extent that the implant 260 overlaps itself underneath the floating gate 206.

Forming the FN tunneling device 230 in a native region 216a creates a diode-like junction underneath the floating gate 206 capable of handling high voltages. FN Tunneling induces electrons to tunnel to and from the floating gate 206 to the first active region 214a, increasing or decreasing the voltage on the floating gate, thereby programming or erasing the floating gate. The amount of voltage on the contact determines how much FN tunneling occurs, and thus by changing the voltage on the contact, the amount and rate of FN tunneling can be controlled. For example, applying a positive threshold voltage (e.g., 18 V) to the first active region 214a and keeping all the other active regions at ground (0V), causes electrons to tunnel off the floating gate 206 to the first active region, thereby increasing the voltage of the floating gate 206 (erasure). Alternatively, capacitively coupling the floating gate 206 up to a positive threshold voltage by bringing both the capacitor and tunnel device up to Vtun (e.g., 18 V) and keeping the read transistor at ground (source 202 and drain 204 at 0V) causes electrons to tunnel from the second active region 214b onto the floating gate 206, thereby decreasing the voltage of the floating gate 206 (program). The voltage needed to erase or program the floating gate 206 depends on the thickness of the gate oxide and the desired erase time. For a 5V gate oxide having a thickness of approximately 125 Angstroms, FN Tunneling is expected to occur in the 13V-19V range. For a 3.3V gate oxide of having a thickness of approximately 75 Angstroms, FN Tunneling is expected to occur in the 8V-10V range.

In one embodiment, the erase operation is performed as a bulk operation, that is, an operation that is performed on a large number of bits in one pass, whereas the program (or write) operation is performed on a bit by bit basis. For example, an erase operation would erase a page (e.g., one thousand bits) by inducing FN Tunneling in devices like FN tunneling device 230 to cause them all to go into the "on" state (e.g., have a high floating gate voltage). A program operation could then selectively program any single floating gate to the "off" state (e.g., having a low floating gate voltage).

When any positive voltage is applied to the first active region 214a, electrons are depleted from doped region 260, creating depletion regions underneath the floating gate. Depending upon the construction of the bitcell, if these depletion regions grow large enough (e.g., if sufficient positive voltage is applied), the depletion region will rise in height from the native region up to the channel directly underneath the floating gate 206, eventually extending across the entire channel length L of the first active region 214a under the floating gate 206. In this circumstance, the short under the floating gate 206 is terminated, and FN tunneling is prevented.

In NMOS devices the more the 5V N-LDD implant overlaps underneath the floating gate 206 delays the growth of the depletion region to higher voltages by simply having more charge carriers present in the region to deplete, thereby providing a larger voltage range to use to perform FN tunneling. Forming the FN tunneling device 230 in a native region 216a enhances this effect by providing relatively few counter-doped charge carriers (e.g., holes) that would otherwise interfere with the N-LDD implant 160 overlap and accelerate the growth of the depletion region and prevent FN tunneling.

To further facilitate FN tunneling at high voltages, the FN tunneling device 230 is configured to have a narrow floating gate 206 over the first active region 214a with a narrow channel (length L). If the floating gate 206 is wider (e.g., if channel length L is increased) FN tunneling shuts off at lower voltages (e.g., below 14 V). As the FN tunneling device is configured to operate under higher voltages than the capacitor 210, the non-active native region around the portion of the native region 216a under the floating gate 206 may be configured to be larger in surface area than in the capacitor 210. The larger the non-active native region enclosure around or at least partially surrounding the floating gate (in a top down view), the higher the diode breakdown of that junction.

In other embodiments, an additional surface implant with the same polarity as the LDD may be added to increase the doping level at or near the surface. Some examples of n-type surface implants are a PMOS n-type $V_T$ adjust implant or a NPN bipolar emitter implant.

Example Structure and Operation of Capacitor

FIG. 2C is a cross sectional view of a capacitor 210 of the NVM bitcell taken along line M-N from FIG. 2A, according to one embodiment. As described above with reference to FIGS. 2A and 2E, the third active region 214c is formed as a native region 216b including an N-well implant 212b.

The portion of the capacitor 210 above the third active region 214c is the same as in FIGS. 2B and 2D along a cross section taken along line M-N, again with the exception of the width of the floating gate 206. Within the third active region 214c, the devices differ in that the third active region 214c includes an N+ implant 262 that extends partway underneath the spacers on all sides. The third active region 214c also includes a 5V N-LLD implant 160 that extends part way or all the way underneath the floating gate 206 on all sides except possibly where the floating gate extends towards the FN tunneling device 230.

The capacitance of the capacitor 210 between the floating gate 206 and third active region 214c is determined by the extent of the overlap between the floating gate 206 and the third active region 214c. For a PMOS capacitor, the entire portion of the third active region 214c under the floating gate 206 capacitively couples to the floating gate, the entire portion is electrically shorted due to the similar polarities of the N-LDD 260 and N+262 implants, as well as the N-well 212b.

When a positive voltage is applied to the third active region 214c, a depletion region is formed in the third active region 214c that grows in size as the voltage is increased. If the depletion region reaches the surface of the substrate, that portion of the capacitor is no longer capacitively coupled to the floating gate 206 due to the lack of charge carriers in the depletion region. Thus, there is a limit to how high in voltage the third active region 214c can be pulled before capacitive coupling falls off due to depletion. This in turn limits how high in voltage the floating gate 206 can be capacitively coupled by an applied voltage.

Referring back to FIG. 2A briefly, the placement of the mask defining the native region may vary during manufacturing due to mask misalignment and variation in resist opening size. A minimum non-active native region enclosure of the capacitor 210 is established to ensure a certain minimum enclosure distance even under a worst case misalignment or opening size variation scenario. Similarly, the N-Well 212b implant of bitcell 200 also has a minimum enclosure of the third active region 214c to ensure the device is correctly doped. If the N-Well resist wall is too close to the FN tunneling device 230 there can be well proximity effect implanted charge carriers, which diminishes the functionality of the bitcell.

In contrast to the NMOS implementation described below with respect to FIGS. 3-5, in a PMOS version of capacitor 210, the N-well 212b and P+S/D contacts (in place of N-LDDs 260) are already shorted together, and thus the LDD regions do not need to be merged under the floating gate. Further, for a PMOS bitcell 200 having a FN tunneling device 200 that has an N-Well 212 under the FN tunneling device 230, the voltage at which the depletion region comes to the surface is typically well above the voltage needed to program or erase the bitcell.

Overall Structure of Native NMOS NVM Bitcell

Figure 3B:
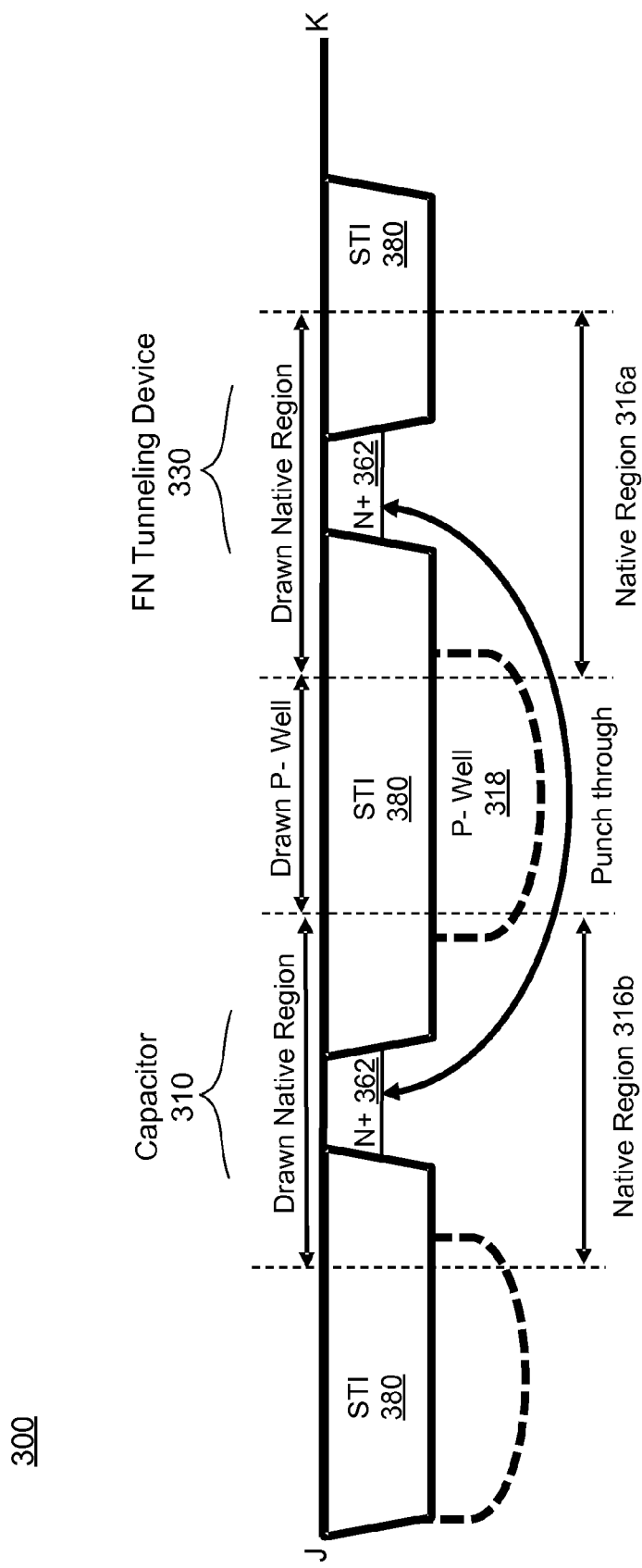
FIG. 3B is a cross sectional view of a portion of an NMOS NVM bitcell including a capacitor and a FN tunneling device taken along line J-K of FIG. 3A, according to an embodiment.

FIG. 3A illustrates a top view of an NMOS NVM bitcell 300 according to one embodiment. Bitcell 300 is mostly the same as bitcell 200, except that the bitcell 300 is an NMOS bitcell because the FN tunneling device 330 and capacitor 310 are each formed in a native region 316a and 316b, respectively. Noticeably absent in bitcell 300 are the N-well implants 212 present in bitcell 200. As a result, bitcell 300 is more compact than bitcell 200, as extra clearance is not required to isolate the N-well implants 212 from bitcell 200. Forming the FN tunneling device 330 and capacitor 310 in a native region also has the benefit of making punch through less likely to occur than in bitcell 200, as illustrated in FIG. 3B immediately below. Otherwise, the components of bitcell 300 are the same as in bitcell 200. Thus, capacitor 310 is otherwise similar to capacitor 210, transistor 320 is otherwise similar to transistor 220, and FN tunneling device 330 is otherwise similar to FN tunneling device 230. In FIG. 3A, the components of bitcell 300 are labeled with reference numerals starting with a digit of "3" rather than a "2" to indicate differences in size, shape, and location relative to their counterparts in bitcell 200, however the last two digits remain the same for comparison. These components function similarly in bitcell 300 as they do in bitcell 200, and are not described again for sake of brevity.

FIG. 3B is a cross sectional view of a portion of an NMOS NVM bitcell 300 including a capacitor 310 and a FN tunneling device 330 taken along line J-K of FIG. 3A, according to an embodiment. In bitcell 300, the capacitor 310 and FN tunneling device 330 are each formed in a native region 316. The active regions 314a, 314b are separated by one or more STIs 380. FIG. 3B illustrates how the native region masks, drawn to define the native regions 316 and the region between them where the P-well 318 is implanted, help electrically isolate the individual native regions 316b and 316a of the capacitor 310 and FN tunneling device 330, respectively, from each other.

As with bitcell 200, the non-active portions (not labeled) of the native regions 316 assist in electrical isolation at the expense of additional substrate space. However, the lack of an N-well implants 212 decreases the total amount of space needed to electrically isolate the devices of the bitcell 300. Similar to bitcell 200, punch through can occur in bitcell 300 when high voltages are applied across the capacitor 310 and/or FN tunneling device 330. However, in contrast to bitcell 200, in bitcell 300 punch through is diminished due to the increased distance charge carriers travel before punch through can occur. Particularly, for punch through to occur in bitcell 300, charge carriers travel vertically between the N+ regions 362 in addition to horizontally around the P-well 318. Contrast this versus bitcell 200 of FIG. 2E, where punch through occurs once charge carriers travel merely horizontally between N-well implants 212.

Removing the N-wells 212 reduces the overall size of bitcell 300 compared to bitcell 200. This allows for a denser NVM memory device. In one embodiment, removing only N-well 212a of bitcell 200 saves bitcell 300 12% on surface area relative to bitcell 200. Removing only N-well 212b saves 4% on bitcell on surface area. Removing both N-wells 212 results in bitcell 300 saving 20% on surface area size. For example, for a 0.18 um 5V process, the N-well generally overlaps the active regions by 0.6 μm. Thus, removing both N-wells reduces the bitcell size by 3*0.6=1.8 μm (N-wells enclose the active region on two sides of the tunnel device and on at least one side of the capacitor).

Removing the N-wells also has other manufacturing benefits. N-wells generally end up being larger than they are drawn, as illustrated by FIG. 2E. This can occur due to "lateral straggle" during implantation where ions ricochet sideways and implant beyond the drawn area. Heat from other process steps can cause N-well implants to diffuse further outside the drawn area as well. Consequently, the design of a bitcell including N-well implants must take into account this effect, unnecessarily increasing the size of the bitcell. Further, N-wells are subject to misalignment as they are not self aligned, which means that the bitcell may be subject to manufacturing variation. The misalignment can be accounted for, but at the expense of additional bitcells size. As P-wells are also subject to misalignment, this means that the manufacturing process for creating an PMOS bitcell 300 must be robust against two different layers being misaligned. In contrast, bitcell 300 does not face this issue with respect to N-wells. Further, a PMOS bitcell's 300 sensitivity to misalignment of the P-well in one direction can be eliminated by having different native region 316 enclosure (i.e., non active native region) widths.

In an NMOS bitcell, the P-Well 318 is shorted to the native regions 316a and 316b. The native regions 316 of one bitcell are electrically shorted to many, if not all, other P-Wells and native regions in the same memory device, and are also typically shorted to ground. In bitcell 300, the P-Well 318 and native regions 316 cannot be brought to a high enough voltage to make a capacitor where the LDDs need to be merged as in bitcell 200. Instead, each P-well to native region junction forms a diode. To account for this, the shape of the floating gate 306 over the first 314a and third 314c active regions can be controlled make a functional capacitor 310 and FN tunneling device 330. As a result, the NMOS bitcell 300 is sensitive to shape, particularly the shapes of the capacitor 310 and FN tunneling device 330.

There are several options for making up for the lack of an N-well in an NMOS capacitor 310. For a NMOS capacitor 310 formed in a native region 316b, the portion of the floating gate 306 extending over the third active region 314c is shaped such that dopings of charge carriers into the third active region 314c are able to penetrate underneath that portion of the floating gate 306. Increasing the floating gate's size over the third active region 314c without also increasing the extent of the N+362 and/or 5V LDD implant does not measurably increase capacitive coupling. Therefore, to reduce bitcell size, the LDD and N+362 implants and the floating gate shape 306 are configured to ensure that the implants extends under the floating gate 306 as much as possible, if not all the way underneath the entirety of floating gate 306. Ideally for an NMOS capacitor, the LDD implants 360 merge under the gate.

Forming the capacitor 310 in a native region advantageously allows for larger capacitive surface areas, because the native region lacks counter-doped charge carriers. The lack of a P-well does two things. First is allows the N-LDD region to merge even where the FN tunneling device of the bitcell has a longer channel length L since there is no counter doping. Second it increases the diode breakdown voltage by grading the diode junction between the implants and the native region. The low doped native region forms much larger depletion regions than would form in a P-Well implementations.

Figure 4:
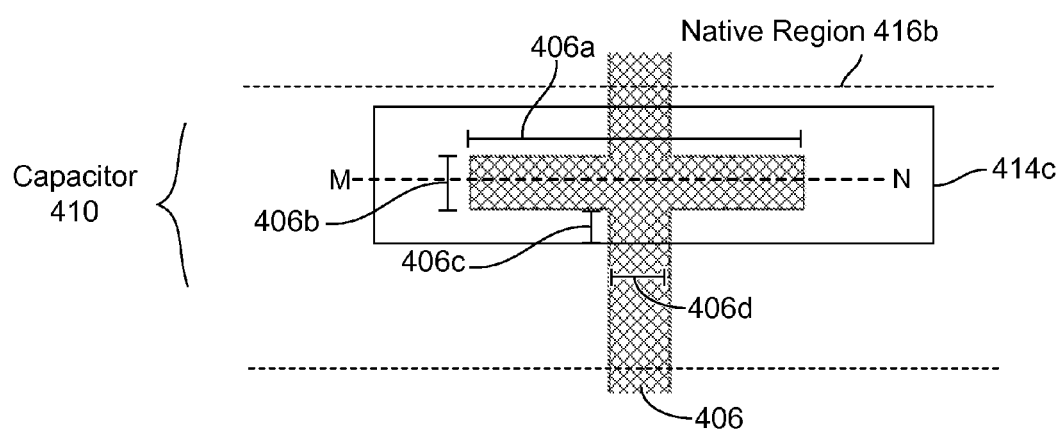
FIG. 4 is a top view of an alternative construction for an NMOS capacitor device 430 for a hybrid PMOS/NMOS bitcell implementation, according to one embodiment.

FIG. 4 is a top view of an alternative construction for an NMOS capacitor device 410 for a NMOS tunnel device bitcell implementation where shorting of the FN tunneling device has better performance with a very short L. The additional fingers of capacitor 410 increase the capacitive coupling surface area used to control the voltage on the floating gate 406. In some implementations, it is not feasible to short the FN tunneling device in the first active region under the floating gate, as is done in the implementation illustrated in FIG. 2D. This is a problem in implementations where the highest voltage implant in any device in the bitcell is 2.5V. This can be the case with particular implant processes, for example processes where the 2.5 V N-LDD implant cannot be implanted with sufficient reach under the floating gate so as to overlap with itself. Despite this, a functional NVM bitcell can still be constructed, using a PMOS tunneling device as illustrated in FIG. 2D and an NMOS capacitor 410 as illustrated in FIG. 4.

In the implementation of FIG. 4, the portion of the floating gate 406 over the third active region 414c has an expanded perimeter relative to the FN tunneling device 230 illustrated in FIG. 2A. The floating gate 406 perimeter is twice length 406b plus twice length 406a plus twice length 406c minus length 406d. Other perimeters are also possible based on other floating gate shapes (not illustrated). The expanded perimeter for the floating gate 406 increases the area underneath the floating gate 406 where implants, such as a 2.5V N-LDD implant, penetrate. This allows for a larger area of overlap between the LDD implant in the third active region 414c and the floating gate 406. The size of the non-active portion of the native region 416a may also be adjusted to properly isolate the capacitor 410.

Figure 5:
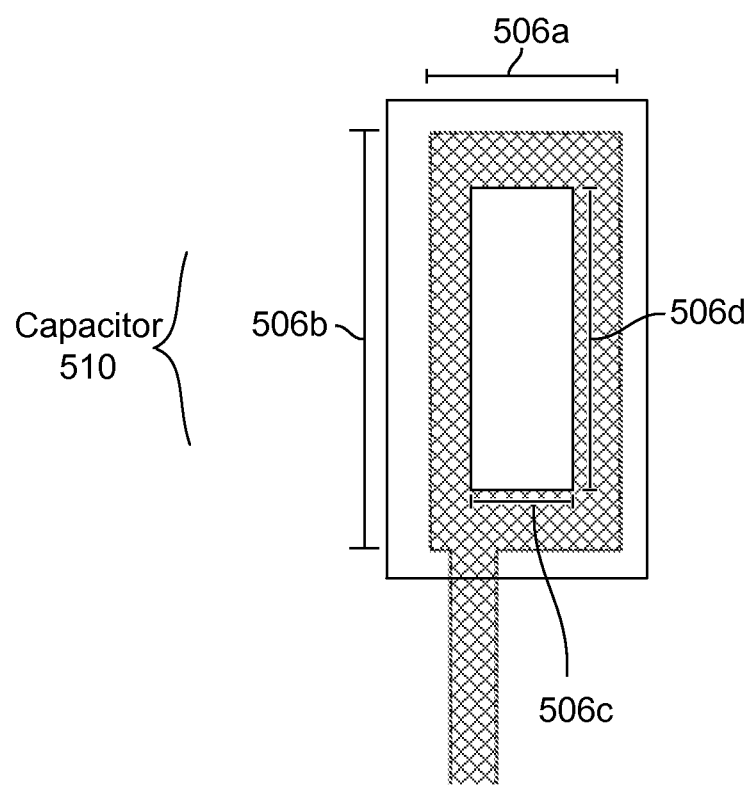
FIG. 5 is a top view of an alternate construction for the capacitor of the NVM bitcell according to one embodiment.

FIG. 5 illustrates an alternate implementation of a bitcell 500 where a NMOS capacitor 510 is formed with a large perimeter to counteract depletion region growth under an applied voltage, according to one embodiment. The portion of the floating gate 506 over the third active region is configured to be below a certain width such that the electrons of the 5V N-LDD implant penetrate all the way underneath that portion of the floating gate 506. This help maintain capacitive coupling even at high applied voltages (e.g., in the range of 7-10V). For example, the floating gate 506 may have an exterior width 506a and length 506b, with a gap of width 506c and length 506d.

NVM Bitcell Operation

The bitcell uses FN tunneling on the FN tunneling device to program and erase the floating gate. The bitcell is read by activating the transistor. The capacitor assists in all three operations. Notably, the bitcell does not include a select device, which would typically be used to isolate which bits are read.

One of many advantages to bitcell is that because capacitor is decoupled from both the source and the drain, the capacitor can be used to adjust the voltage on the floating gate without affecting the voltages at the source or the drain. Due to the capacitance between floating gate and the third active region, the floating gate voltage will be a proportion of whatever voltage is applied at the third active region. For example, if there is a 70% total capacitive coupling between the floating gate and the third active region, the field oxide gate area where the floating gate is over STI, capacitive coupling to nearby metal lines (small), and any lateral capacitive couplings (e.g., coupling to contacts or adjacent floating gates). then the floating gate voltage will coupled by 50% of the voltage change applied to the third active region (i.e., at the metal contact electrically coupled to the third active region). The ability to bias the floating gate without affecting the source voltage or the drain improves control over read and FN program/erase operations.

Table 1 set forth below illustrates read, program, and erase operation for an example embodiment. Vdd may vary during operation (e.g., many power supplies have a +/−10% spec, so 5V can be 4.5V to 5.5V. In some designs a program/check/program if needed algorithm is used where Vtun is increased with each successive prog operation. This algorithm allows each chip to adjust its Vtun level depending on process variation (i.e. gate oxide thickness) and temperature.

TABLE 1

| Bitcell 100 Operation (5 V example) | | | | | |
|---|---|---|---|---|---|
| Operation | Vcap | Verase | Vd | Vs | P-well |
| Read Selected | Vdd (5 V) | 0 | 0 | Vdd (5 V) | 0 |
| Read Unselected | 0 | 0 | 0 | Vdd (5 V) | 0 |
| Erase Selected | 0 | Vtun (18 V) on active | 0 | 0 | 0 |
| Erase Unselected | 0 | 0 | 0 | 0 | 0 |
| Program Selected | Vtun (18 V) | Vtun (18 V) on active | 0 or Vtun/2 (0 or 9 V) | 0 or Vtun/2 (0 or 9 V) | 0 |
| Program Unselected | Vdd (5 V) | 0 | X (0 or 9 V) | X (0 or 9 V) | 0 |
| Idle | 0 | 0 | 0 | 0 | 0 |

To erase the floating gates of the selected row, the FN tunneling device (specifically, the first active region) is set to a high positive voltage Vtun. In a 5 V example bitcell, Vtun may be 18 V. This large positive voltage is sufficient to cause electrons to tunnel (via FN tunneling) from floating gate to the first active region. This causes the floating gate to become more positively charged, and thus be at a higher (more positive) voltage. During erasure, all other contacts may be maintained at or near zero volts.

FN tunneling is advantageous, among other reasons, because it requires significantly less current than other effects, such as band to band tunneling (BTBT). For a comparison, FN Tunneling typically requires approximate 1 nano-amp (nA) to erase a bit, while BTBT requires approximately 1 micro-amp (uA) to erase a bit for the same erase time. Consequently, 1000 times as many bits may be erased with FN Tunneling versus with BTBT where current capability is limited. As a result, in products with 512K bits or less, all rows can be erased simultaneously with FN Tunneling. A whole-device single erase operation can be performed very quickly, significantly decreasing the time needed to erase the bitcell. Generally, it is advantageous that the bitcell can be erased rapidly. Rapid erasure is important during NVM memory device testing, as not all NVM memory devices will work correctly owing to the small but significant number of defects that happen in the manufacturing process. Rapid erasure during testing allows a tester to more quickly verify if a given NVM memory device is operating correctly.

Due to the lack of a select device, programming the floating gate instead makes use of the FN tunneling device, capacitor, and transistor in conjunction. To program a selected bitcell, the capacitor of a selected row is set to a high positive voltage Vtun (e.g., 18V). Consequently, the floating gate side of the FN tunneling device will also be set to positive voltage Vtun (e.g., 18 V). This causes electrons to tunnel from the first active region up to the gate, thereby decreasing the positive charge on the floating gate.

During programming the floating gate is coupled up to a high voltage by pulling both the capacitor and the active region of the FN tunneling device to a high voltage (Vtun). Programming occurs through the read device, the only device selectable column-wise. Electrons are added to the floating gate by the read device if it is at ground. For unselected rows, programming is inhibited by bringing the source and drain of the read device up to a voltage sufficient to prevent FN Tunneling.

During programming, the source and drain of the transistor of that bitcell are each set to a same voltage, either zero volts or around half of Vtun (e.g., Vtun/2=9 V). As illustrated in FIG. 1A, the source and drain are powered along the columns of a memory device. Thus, when one bitcell's source and drain are set to a voltage, the sources and drains of other bitcells of that selected column are similarly set to that voltage. This is indicated by the "X" in Table 1. Holding the sources and drains of the bitcells of a selected column to the same voltage prevents leakage currents from affecting the voltage of the floating gates of those bitcells. Stated more generally, when the capacitor is brought to Vtun the read device is turned on. This shorts the source and the drain of the read device together through the channel during the program operation. Trying to have the source and drain be at different voltages during the prog operation would take a significant amount of current. To further ensure that the other bitcells of the column are not affected by a program operation of one bitcell in that column along the selected row, the capacitors of the other rows may be set to a moderate but non-zero voltage Vdd (e.g., 5V). This capacitance decreases or eliminates leakage current, particularly if multiple rows of FN tunneling devices are electrically coupled together.

To read the voltage on floating gate of the bitcell, the source of the bitcell is set to a moderately positive voltage, for example Vdd (e.g., 5 V). As introduced with respect to the program operation above, setting the source and drain voltages sets the voltage for all sources and drains along that column. To select a particular row's bitcell to read, the capacitor of the selected row is set to a moderately positive voltage, again for example Vdd (e.g., 5 V). The bitcell is configured such that despite the voltage on the floating gates of the other bitcells of the column, the lack of capacitive coupling provided from the capacitor means that the transistors of those other bitcells are incapable of turning on. This means that erased cells (cell that will be in a high current state during read) generally have an unselected read condition floating gate voltage that induces no significant current.

The transistor of the selected bitcell selectively activates based on the charge/voltage on the floating gate and the capacitor voltage. If the voltage is sufficiently positive, the transistor of the selected bitcell will activate, causing a current to flow across the transistor. This current can be read by external logic devices (not shown). This is considered the "on" state. Conversely, if the voltage is not sufficiently positive, little to no current will flow and the bitcell will be in the "off" state when the capacitor is coupled up. An example valid condition for operation is that no current flows when the capacitor is at 0V, and when the capacitor is at 5V erased floating gates have very high current and programmed floating gates have a small current.

Summarizing all three operations, an erase operation causes the FN tunneling devices of the bitcells of a row to raise the floating gate voltage of the bitcells of that row to the same positive voltage or "on" state (e.g., logical state 1). Individual bitcells can then be switched to the "off" state (e.g., logical state 0) by increasing voltage at the capacitor, floating gate, and FN tunneling device along a selected row and then setting the source drain voltages of the bitcells of the selected column to a same voltage so that electrons tunnel onto the floating gate. The bitcells along the selected column are unaffected by this operation because at least their capacitors are not similarly coupled to the same high voltage. This scheme not only prevents accidentally programming the wrong bitcell, but also preventing accidental leakage currents that would affect charge level.

Bitcell may also make use of adaptive read schemes which adjust the voltage on the capacitor to compensate for process-voltage-temperature (PVT) variations. PVT variations can affect the amount current provided during read. Repeated cycling (programming and erasing) can result in charge trapping at the interface between the channel and the gate oxide. Charge trapping can cause a shift in the threshold voltage $V_T$ of a bitcell, thereby affecting the performance of the bitcell. Adaptive read schemes may be used to compensate for erroneous bitcell performance due to PVT or charge trapping. In one embodiment, an adaptive read scheme is implemented by using a reference bitcell programmed to a logical state of 1 to set bias conditions such that a known read current is provided. The read current of the reference bitcell may be used to adjust the various voltages used to read the bitcell. The reference bitcell should behave the same as the bitcell under various PVT conditions. The adaptive read scheme may then adjust the capacitor 110 voltage to compensate for any changes in the threshold voltage of the bitcell due to PVT variations. In one embodiment, reference bitcells are cycled with respect to row in a bitcell array to better mimic charge trapping behavior and therefore better control the adaptive read scheme.

Alternative Embodiments

Although the various embodiments of the NVM bitcell have been described with respect to a 5V CMOS logic process, in other embodiments the NVM bitcell may also be constructed according to a 3.3V, 2.5 V, or a 1.8V CMOS logic process. The channel length L of the short in the FN tunneling device, the dopants, and other specifications of the NVM bitcell are expected to vary in these other CMOS logic processes, however the functionality and features of the bitcell remain the same across implementations. For example, in a 3.3 V embodiment, the channel length L of the FN tunneling device will be shorter than in 5V embodiment. The channel length L will be shorter in a 2.5 V embodiment than in a 3.3 V embodiment, and so on.

Effect of Photo Resist Scaling on Diode Breakdown Behavior

As described above with reference to FIGS. 2A and 2D, in some implementations the FN tunneling device (e.g., FN tunneling device 330) and/or the capacitor (e.g., capacitor 310) are formed in a native region that is un-doped by additional implants following receipt of the wafer (or substrate) from the original manufacturer. During the manufacture of the NVM bitcell, dopant implantation is controlled using masks that define where the dopants are not permitted to penetrate into the substrate. Masks may include photo resist blocks that are temporarily positioned between the dopant source and the substrate to prevent implantation of dopants in particular regions of the substrate. Masks may also include portions of the NVM bitcell, for example the oxide and spacers of the bitcell act as masks that prevents dopants from penetrating under portions of the floating gate.

The implantation methods used to implant dopants into the substrate often cause dopants to penetrate in regions of the substrate that have been blocked off by masks. This behavior is expected and in fact intended in many instances, for example implants 260 and 262 are designed to implant dopants beyond the regions of the substrate defined by a mask. These implant processes can cause problems where a native region of the bitcell is desired for functionality.

Figure 6A:
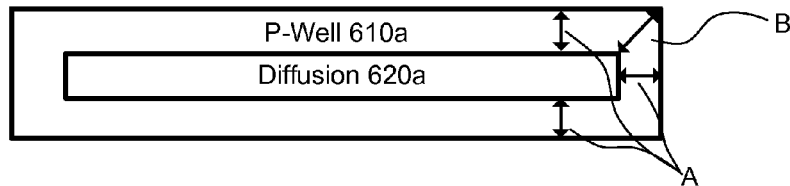
FIG. 6A illustrates a planned diffusion region and P-Well photo resist pattern as drawn in a database or as made on a mask for forming a P-well in a substrate.
Figure 6B:
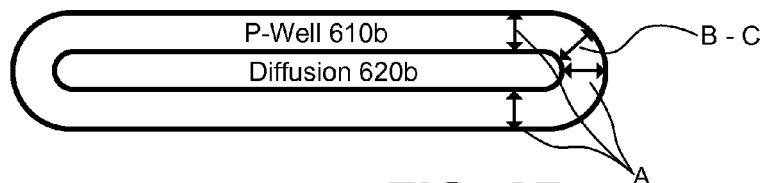
FIG. 6B illustrates a resulting, in process photo resist for forming the diffusion and a P-well as printed on the wafer surface.

One example where implant processes can cause problems with a native region is exhibited in FIGS. 6A and 6B. The standard CMOS logic process includes a diffusion or active step. This step determines what portions of the substrate are formed into STI regions and active/diffusion regions. Due to the nature and relative importance of this step, generally thin, high quality photoresists 620a are used in conjunction with "hard masks" (typically a nitride layer) to define a portion of the substrate where STI is not formed. Due to the thickness of the photoresist, the quality of the photoresist, and nature of the process, the "rounding" of the masked areas is minimal. In advanced processes Optical Proximity Corrected (OPC) is also used to reduce corner rounding. Rounding is a difference between a region is defined on a mask and how it ends up in the on the wafer after all the processing. Rather than being manufactured exactly as defined by the mask, rounding occurs at nonlinear boundaries of the defined region, due to the manner in which light interacts with the photoresist during the exposure. The term "rounding" refers to the tendancy of sharp transitions in direction in a photoresist to round out in practice.

The standard CMOS logic process also includes a P-well photo resist step for forming a P-well such as P-well 218. The P-well photoresist step uses a very thick photo resist 610a. The thick photo resist is needed to block the deep well implants. The thick photo resist forces the photo process to use a lot of light, high exposure dose, to expose the full thickness of the photo resist. As the exposure dose increases the rounding of corners increases. FIGS. 6A and 6B illustrate the difference in rounding between the two types of photoresists 610a and 620a, where FIG. 6A illustrates a photoresist as planned, and FIG. 6B illustrates the resulting actual photo resists 610b and 620b in process. In FIG. 6B the enclosure the diffusion 620b by the P-Well photo resist 610b is smaller in region B-C than it is in region A.

Figure 7A:
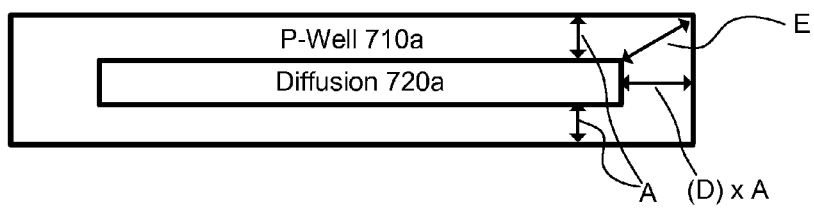
FIG. 7A illustrates two patterns in the database or on a mask to used to make the diffusion region and the photo resist for forming a P-well in a substrate according to one embodiment.
Figure 7B:
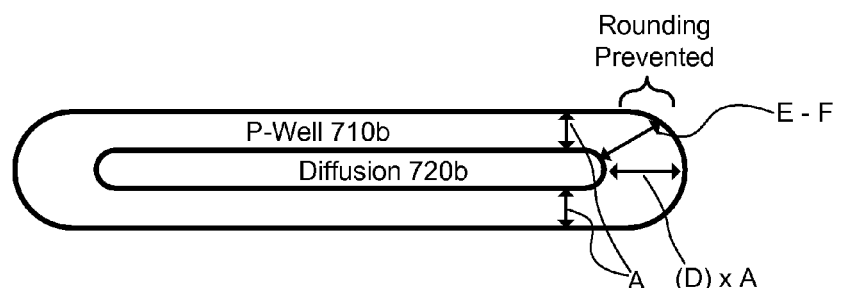
FIG. 7B illustrates a resulting, diffusion shape on the wafer and the resulting P-Well photo resist pattern on the wafer according to one embodiment.

Rounding during dopant implantation causes unwanted dopants to be implanted into regions (such as a native region) that are not intended to have additional dopants. FIGS. 7A and 7B illustrate an example planned 710a, 720a and actual photoresists 710b, 720b for use in generating the bitcell 200 or 300 in one embodiment. The size of the photo resist 710a is configured to account for rounding that is expected to occur by increasing the size of the photo resist along one axis relative to another axis. In FIG. 7A, the P-well 710a and diffusion 720a photoresists are illustrated as having a rectangular shape for example purposes only. In practice other shapes may be used and the illustrated example is intended to highlight a difference in length along one of two coordinate axes.

In FIG. 7A, along a vertical axis the photo resist 710a is longer than the diffusion 720a by a distance A, which is the same as length difference A from FIG. 6A. Along a horizontal axis, however, rather than being the same width A as the photo resist 610a, the width of the photo resist 710a is a scalar multiple times greater than the width (e.g., a scalar D times A). More generally, the photo resist 610a extends further out from the diffusion 720a along one axis relative to another axis. FIG. 7B illustrates how the photo resist 710b will perform in practice with respect to rounding and implantation of dopants. In contrast to the rounding B minus C resulting from photo resist 610b, photo resist 710b instead results in rounding E minus F. The distance E minus F is larger than the distance B minus C.

Preventing implantation into the native region using the photo resists illustrated in FIGS. 7A and 7B improves diode breakdown behavior in the resulting device by delaying diode breakdown behavior to higher voltages. As above, this provides more dynamic range for applying high voltages in order to induce effects such as FN tunneling. In the NVM bitcell, diode breakdown behavior occurs first (e.g., at the lowest applied voltages) along the shortest distance between the doped region and the native region. In the example of FIG. 6B, this shortest distance is distance B-C. However, if bitcell 200 is constructed using the masks 710a and 710b, diode breakdown behavior instead occurs through distance A, as due to the extension D times A, distance E minus F is greater than distance A. Thus, extending the P-well 710b photo resist by factor D delays diode breakdown behavior to higher voltages because the shortest distance for diode breakdown behavior to occur through is distance A, rather than the shorter distance B minus C.

Figure 8:
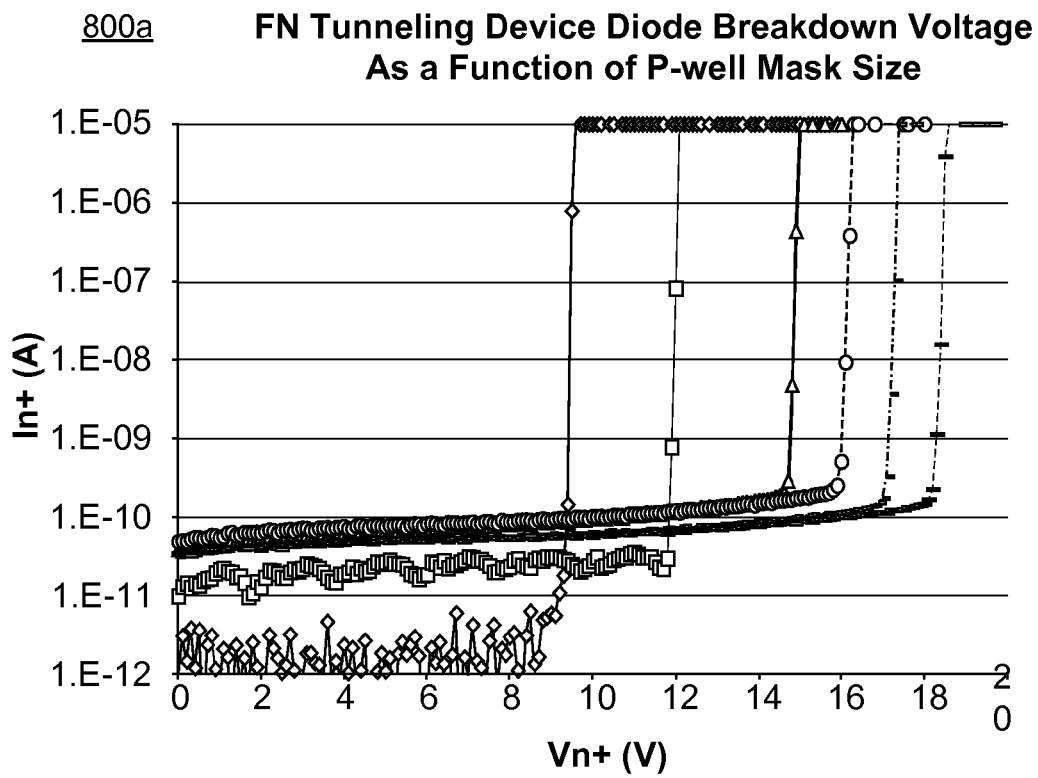
FIG. 8 is a graph plotting diode breakdown voltages of a FN tunneling device formed using several different P-well masks, according to one embodiment.

FIG. 8 is a graph plotting diode breakdown voltages of a FN tunneling device formed using several different P-well layout embodiments. Mask=0 indicates no native exists. For lines with two number, the first number indicates extension in the vertical direction, whereas the second number indicates extension in the horizontal direction. For example, Mask=0.3/0.3 is an example case where both directions have been extended the same amount, whereas mask=0.45/0.75 is an example case where the vertical direction has only been extended by a factor of 0.45 relative to the horizontal direction's expansion of 0.75.

Generally, these plots illustrate that extension of the P-well mask in both directions generally improve (e.g., delay) diode breakdown behavior to higher voltages. Further, these plots illustrate that extension of the P-well mask along one axis but not another also improves diode breakdown behavior. Given that bitcell space is constrained and it is desirable to reduce the space taken up by the bitcell wherever possible, embodiments where the P-well mask is extended along one axis but not another provide an attractive tradeoff for improved diode breakdown behavior that linearly scales with bitcell surface area increases. This is better than extending along both axes simultaneously, which improves diode breakdown behavior at the cost of $N^2$ scaling of bitcell surface area. Regardless, both options provide a viable mechanism for improving diode breakdown behavior to manufacture a functional NVM bitcell.

Effect of Channel Lengths C and L on Bitcell Behavior

Another characteristics of the NVM bitcell that may vary between implementations is the channel length C of the capacitor and the channel length L of the FN tunneling device. The graph of FIG. 8 illustrates how varying this feature affects the performance of the bitcell. Currently, when manufacturing using a 0.18 μm CMOS logic process, the smallest channel length L or C that can be constructed for a 5V doping is 0.6 μm, due to the expected doping overlap. However, the FN tunneling device can be manufactured beneath this 0.6 μm minimum down to at least 0.18 μm (for a 1.8V device with appropriate well and LDD implants). More generally, any aspect of bitcell can be manufactured down to a channel length (e.g., L or C) of 0.18 μm L. While such a narrow gate is not necessary for a capacitor, the result of creating a FN tunneling device with a channel length L this short is that the 5V doping will penetrate underneath the floating gate and overlap with itself, thereby shorting the first active region. The greater the overlap, the higher the voltage on the first active region can be increased without destroying the short created by the doping (or, the greater "dynamic range" of voltage that can be applied without destroying the short). Having a greater dynamic range provides a larger voltage range to use for causing FN tunneling or for capacitive coupling, for example for use in the FN tunneling device and capacitor, respectively.

A bitcell may also have channel lengths L and C not shorter than 0.4 μm. However, generally shorter lengths channels are preferable, as shorter channels correspond to better intersection/overlap in dopings, resulting in a device in which FN tunneling and capacitive coupling is more easily performed at lower voltages. As the channel length increases, doping intersection/overlap is reduced, the doping-induced short is less robust and consequently making these effects more difficult to perform.

The FN tunnel device width and channel length L are improved based on the following following considerations. Ideally, the FN tunneling device should be as small as possible to reduce its total capacitance. Typically, the capacitor has a percentage of the total bitcell capacitance, for example such as 70% so that the capacitor dominates the bitcell's capacitance and can therefore control the voltage on the floating gate. The smaller the FN tunneling device and read devices are, the smaller the capacitor needs to be to achieve this percentage of total bitcell capacitance, and thus the smaller the overall bitcell size.

As devices get smaller, device to device variation typically increases (e.g., between FN tunneling devices of different bitcells in a single memory device). Consequently, two FN tunneling devices with the same width and L next to each other in the same array at the same voltage can have different FN Tunneling currents. To reduce device variance, devices can be made a little larger.

Another consideration is erase/write time. In one embodiment, the read device and tunneling device are designed, and then the capacitor is sized to meet a desired capacitive coupling ratio between the third active region and the floating gate. The smaller the tunneling device, the smaller the capacitor can be while maintaining the desired capacitive coupling ratio. The smaller the tunneling device, the less total current running through it, resulting in a longer erase/write time. Thus, when deciding on the size of the bitcell, a decision is made regarding how large the bitcell will be versus how long the device will take to erase/write.

Overview of Electronic Design Automation Design Flow

Figure 9:
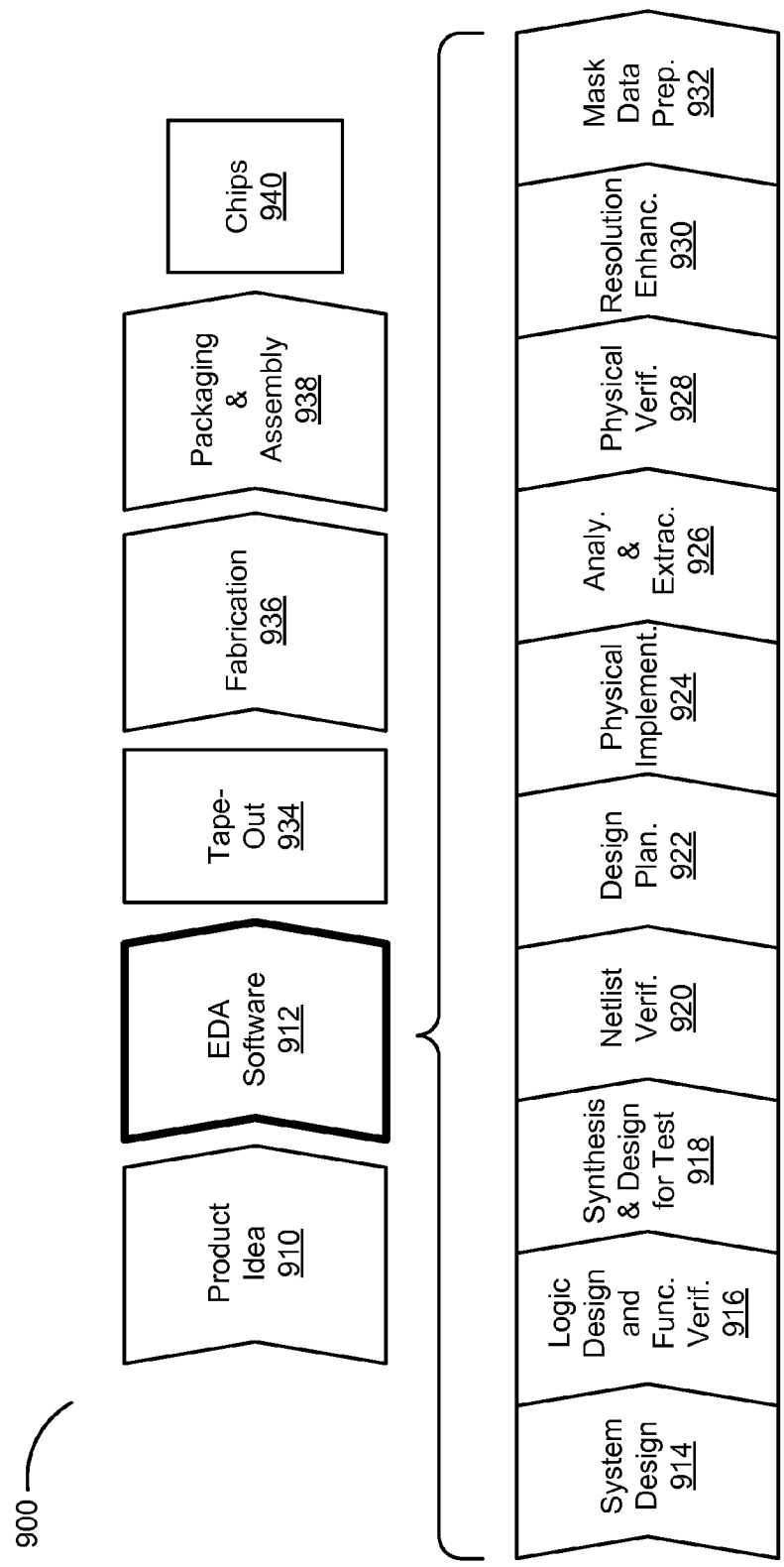
FIG. 9 is a flowchart illustrating the various operations in the design and fabrication of an integrated circuit such including the NVM bitcell, according to one embodiment.

FIG. 9 is a flowchart illustrating the various operations in the design and fabrication of an integrated circuit such including the NVM bitcell, according to one embodiment. This process starts with the generation of a product idea 910, which is realized during a design process that uses electronic design automation (EDA) software 912. When the design is finalized, it can be taped-out 934. After tape-out, a semiconductor die is fabricated 936 to form the various objects (e.g., a bitcell including gates, metal lines, vias) in the integrated circuit design. Packaging and assembly processes 938 are performed, which result in finished chips 940.

The EDA software 912 may be implemented in one or more computing devices including a memory. An example of a memory is a non-transitory computer readable storage medium. For example, the EDA software 912 is stored as instructions in the computer-readable storage medium which are executed by a processor for performing operations 914-932 of the design flow, which are described below. This design flow description is for illustration purposes. In particular, this description is not meant to limit the present disclosure. For example, an actual integrated circuit design may require a designer to perform the design operations in a difference sequence than the sequence described herein.

A cell library incorporating one or more NVM bitcells or circuits as described above may be stored in the memory. The cell library may be referenced by the EDA software 912 to create a circuit or electronic device incorporating the NVM bitcells or circuits.

During system design 914, designers describe the functionality to implement. They can also perform what-if planning to refine the functionality and to check costs. Note that hardware-software architecture partitioning can occur at this stage. During logic design and functional verification 916, VHDL or Verilog code for modules in the circuit is written and the design is checked for functional accuracy. More specifically, the design is checked to ensure that it produces the correct outputs. During synthesis and design for test 918, VHDL/Verilog is translated to a netlist. This netlist can be optimized for the target technology. Additionally, tests can be designed and implemented to check the finished chips. During netlist verification 920, the netlist is checked for compliance with timing constraints and for correspondence with the VHDL/Verilog source code.

During design planning 922, an overall floor plan for the chip is constructed and analyzed for timing and top-level routing. Example EDA software products from Synopsys, Inc. of Mountain View, Calif. that can be used at this stage include: Astro® and IC Compiler® products. During physical implementation 924, the placement (positioning of circuit elements) and routing (connection of the same) occurs. During analysis and extraction 926, the circuit function is verified at a transistor level, which permits refinement. During physical verification 928, the design is checked to ensure correctness for: manufacturing, electrical issues, lithographic issues, and circuitry. During resolution enhancement 930, geometric manipulations of the layout are performed to improve manufacturability of the design. During mask-data preparation 932, the 'tape-out' data for production of masks to produce finished chips is provided.

Embodiments of the present disclosure can be used during one or more of the above-described stages. Specifically, in some embodiments the present disclosure can be used in EDA software 912 that includes operations between design planning 922 and physical implementation 224.

Additional Considerations

Figure 10:
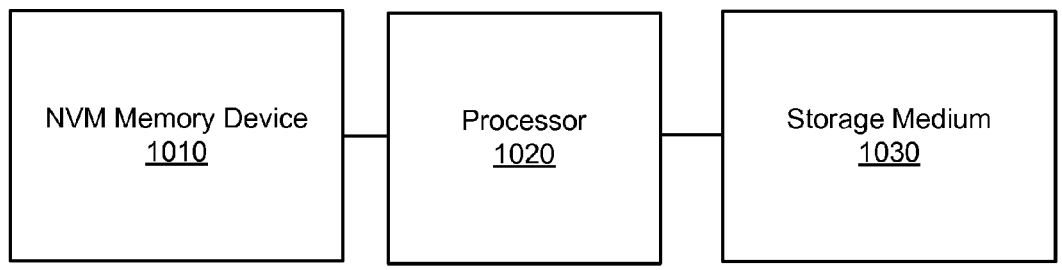
FIG. 10 is a block diagram illustrating a computer system including an NVM memory device, according to one embodiment.

FIG. 10 is a block diagram illustrating a computer system 1000 including an

NVM memory device, according to one embodiment. The computer system 1000 includes an NVM memory device 1010, a processor 1020, and a tangible, non-transitory computer readable storage medium 1030. The storage medium comprises a set of computer code instructions for how the NVM memory device 1010 is to be operated. Specifically, it contains instructions on performing program, read, and erase operations with the bitcells of the NVM memory device 1010. The instructions may be embodied in storage medium in physical circuits, a field programmable gate array, firmware, or software. The processor 1020 accesses the instructions stored in the storage medium 1030 to perform program, read, and erase operations with the NVM memory device 1010.

Upon reading this disclosure, a reader will appreciate still additional alternative structural and functional designs through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A non-volatile memory bitcell comprising:
    a tunneling device comprising:
        a first portion of a floating gate, and
        a first active region of a substrate beneath the first portion of the floating gate, the applying of a tunneling voltage to the first active region causing charge carriers to transition to the floating gate, the first active region comprising a first charge carrier implant overlapping beneath the first portion of the floating gate;
    a transistor comprising:
        a second portion of the floating gate,
        a source in a second active region of the substrate, the second active region including a P-well implant, and
        a drain in the second active region, a current flowing between the source and drain based on a voltage level of the floating gate and a voltage difference between the source and the drain; and
    a capacitor comprising:
        a first plate comprising a third active region of the substrate, the third active region including an N implant extending beneath the third portion of the floating gate, and
        a second plate comprising a third portion of the floating gate above the third active region, the third portion of the floating gate capacitively coupling the floating gate to the third active region to control charge carrier transition in the tunneling device and the current between the source and the drain of the transistor,
        the third active region comprising a second charge carrier implant extending beneath the third portion of the floating gate, the second charge carrier being interspersed with at least a portion of the N implant.

2. The non-volatile memory bitcell of claim 1, wherein at least one of the first and third active regions is formed in a native region.

3. The non-volatile memory bitcell of claim 1, wherein the first active region includes an N-well implant.

4. The non-volatile memory bitcell of claim 1, wherein the source of the transistor is electrically coupled to a source of a transistor in a first adjacent bitcell, and wherein the drain of the transistor is electrically coupled to a drain of transistor in the first adjacent bitcell.

5. The non-volatile memory bitcell of claim 4, wherein the first active region is electrically coupled to an active region of a second adjacent bitcell, and wherein the third active region is electrically coupled to a capacitor of the second adjacent bitcell.

6. The non-volatile memory bitcell of claim 1, wherein the tunneling device is a Fowler Nordheim (FN) tunneling device.

7. The non-volatile memory bitcell of claim 1, wherein the first active region, the second active region, and the third active region are separated by nonconductive regions.

8. The non-volatile memory bitcell of claim 1, wherein the first, second, and third portions of the floating gate are electrically coupled together.

9. The non-volatile memory bitcell of claim 1, wherein the tunneling device is configured to prevent diode breakdown behavior in the first active region when the first active region is raised to at least a threshold voltage sufficient to produce FN tunneling.

10. The non-volatile memory bitcell of claim 1, wherein the first charge carrier implant is an N-type lightly doped drain (LDD) implant.

11. The non-volatile memory bitcell of claim 1, wherein the second charge carrier implant extends beneath an entire length of the third portion of the floating gate.

12. The non-volatile memory bitcell of claim 1, wherein the second charge carrier implant is an N-type lightly doped drain (LDD) implant.

13. The non-volatile memory bitcell of claim 1, wherein the bitcell is fabricated using a standard complementary metal oxide semiconductor (CMOS) logic process.

14. The non-volatile memory bitcell of claim 1, wherein the capacitor and the tunneling device are NMOS, and both comprise a threshold voltage adjustment implant,
    wherein the threshold voltage adjustment implant of the capacitor is in the third active region underneath the floating gate near a surface of the substrate and is at least partially co-extensive with the N implant and the second charge carrier implant,
    wherein the threshold voltage adjustment implant of the tunneling device is in the first active region underneath the floating gate near the surface of substrate and is at least partially co-extensive with the first charge carrier implant.

15. The non-volatile memory bitcell of claim 1, wherein the capacitor and the tunneling device are PMOS, and both comprise a threshold voltage adjustment implant,
    wherein the threshold voltage adjustment implant of the capacitor is in the third active region underneath the floating gate near a surface of the substrate and is at least partially co-extensive with the N implant and the second charge carrier implant,
    wherein the threshold voltage adjustment implant of the tunneling device is in the first active region, underneath the floating gate near the surface of substrate and is at least partially co-extensive with the first charge carrier implant.

16. The non-volatile memory bitcell of claim 1, wherein at least one of the capacitor and the tunneling device include a shallow well implant,
    wherein the shallow well implant, if part of the capacitor, is in the third active region, underneath the floating gate near a surface of the substrate and is at least partially co-extensive with the N implant and the second charge carrier implant, wherein the shallow well implant, if part of the tunneling device, is in the first active region underneath the floating gate near the surface of substrate and is at least partially co-extensive with the first charge carrier implant.

17. The non-volatile memory bitcell of claim 1, wherein a channel region of the transistor comprises a threshold voltage adjustment implant comprising a same polarity type as the channel region and a different polarity type than the source and drain, wherein the threshold voltage adjustment implant of the transistor is in the second active region underneath the floating gate near a surface of the substrate and is at least partially co-extensive with the P-well implant.

18. A non-volatile memory device comprising:
a plurality of non-volatile memory bitcells formed in a substrate, the bitcells arranged along a plurality of rows and a plurality of columns, each bitcell comprising:
  a tunneling device comprising a first active region of the substrate and a first portion of a floating gate extending over the first active region, the first active region comprising a first charge carrier implant overlapping beneath the first portion of the floating gate,
  a transistor comprising a second active region of the substrate, the second active region of the substrate comprising a source, a drain, the transistor further comprising a second portion of the floating gate extending over the second active region, the second active region including a P-well implant, and
  a capacitor comprising a third active region of the substrate and a third portion of the floating gate extending over the third active region, the third active region including an N implant extending beneath the third portion of the floating gate, the third active region comprising a second charge carrier implant extending beneath the third portion of the floating gate, the second charge carrier being interspersed with at least a portion of the N implant;
a first conductive line electrically coupling tunneling devices of a first plurality of the bitcells along one of the plurality of rows;
a second conductive line electrically coupling capacitors of the first plurality of bitcells along the same row;
a third conductive line electrically coupling sources of a second plurality of the bitcells along one of the plurality of columns; and
a fourth metal line for electrically coupling drains of the second plurality of the bitcells along the same column.

19. A non-transitory machine readable medium storing instructions that when executed by a processor of a manufacturing facility apparatus causes the apparatus to manufacture a non-volatile memory bitcell that comprises:
a tunneling device comprising:
  a first portion of a floating gate, and
  a first active region of a substrate beneath the first portion of the floating gate, the applying of a tunneling voltage to the first active region causing charge carriers to transition to the floating gate, the first active region comprising a first charge carrier implant overlapping beneath the first portion of the floating gate;
a transistor comprising:
  a second portion of the floating gate,
  a source in a second active region of the substrate, the second active region including a P-well implant, and
  a drain in the second active region, a current flowing between the source and drain based on a voltage level of the floating gate and a voltage difference between the source and the drain; and
a capacitor comprising:
  a first plate comprising a third active region of the substrate, the third active region including an N implant extending beneath the third portion of the floating gate, and
  a second plate comprising a third portion of the floating gate above the third active region, the third portion of the floating gate capacitively coupling the floating gate to the third active region to control charge carrier transition in the tunneling device and the current between the source and the drain of the transistor,
  the third active region comprising a second charge carrier implant extending beneath the third portion of the floating gate, the second charge carrier being interspersed with at least a portion of the N implant.

* * * * *

UNITED STATES PATENT AND TRADEMARK OFFICE
CERTIFICATE OF CORRECTION

PATENT NO.        : 9,553,207 B2                                           Page 1 of 1
APPLICATION NO.   : 14/036249
DATED             : January 24, 2017
INVENTOR(S)       : Horch et al.

It is certified that error appears in the above-identified patent and that said Letters Patent is hereby corrected as shown below:

In the Claims

Claim 3, Line 57: replace "an N-well implant" with --an N implant--.

Signed and Sealed this
Eighteenth Day of April, 2017

Michelle K. Lee
*Director of the United States Patent and Trademark Office*